(12) United States Patent
Onodera et al.

(10) Patent No.: US 9,439,303 B2
(45) Date of Patent: Sep. 6, 2016

(54) CIRCUIT BOARD AND METHOD FOR MANUFACTURING SAME

(71) Applicant: KURARAY CO., LTD., Kurashiki-shi (JP)

(72) Inventors: Minoru Onodera, Saijo (JP); Shuji Matsunaga, Saijo (JP); Tatsuya Sunamoto, Saijo (JP); Shigeaki Suzuki, Tokyo (JP)

(73) Assignee: KURARAY CO., LTD., Kurashiki-shi (JP)

( * ) Notice: Subject to any disclaimer, the term of this patent is extended or adjusted under 35 U.S.C. 154(b) by 0 days.

(21) Appl. No.: 14/662,580

(22) Filed: Mar. 19, 2015

(65) Prior Publication Data

US 2015/0195921 A1   Jul. 9, 2015

Related U.S. Application Data

(63) Continuation of application No. PCT/JP2013/074719, filed on Sep. 12, 2013.

(30) Foreign Application Priority Data

| Sep. 20, 2012 | (JP) | 2012-206412 |
| Oct. 18, 2012 | (JP) | 2012-230734 |
| Oct. 18, 2012 | (JP) | 2012-230735 |
| Jan. 10, 2013 | (JP) | 2013-002507 |

(51) Int. Cl.
*H05K 1/00* (2006.01)
*H05K 3/46* (2006.01)
(Continued)

(52) U.S. Cl.
CPC .......... *H05K 3/4602* (2013.01); *C09K 19/2014* (2013.01); *C09K 19/3087* (2013.01);
(Continued)

(58) Field of Classification Search
CPC ............ H05K 1/00; H05K 1/02; H05K 1/03; H05K 1/11; H05K 1/14; H05K 1/16; H05K 1/18; H05K 3/00; H05K 3/02; H05K 3/10; H05K 3/14; H05K 3/20; H05K 3/22; H05K 3/40; H05K 3/46; H05K 3/48; H01L 21/02; H01L 21/48; B32B 3/00; B32B 5/16
USPC .............. 174/258, 250, 251, 254, 255, 257, 174/260–262, 264–266, 268; 428/292.1, 428/313.3, 323
See application file for complete search history.

(56) References Cited

U.S. PATENT DOCUMENTS 4,104,323 A * 8/1978 Hansen ................. C09J 7/0221
                                                              524/505
6,254,971 B1   7/2001 Katayose et al.
(Continued)

FOREIGN PATENT DOCUMENTS

| JP | 07-094835 | 4/1995 |
| JP | 11-309803 | 11/1999 |

(Continued)

OTHER PUBLICATIONS

International Search Report issued in International Application No. PCT/JP2013/074719, dated Oct. 15, 2013.
(Continued)

*Primary Examiner* — Xiaoliang Chen
(74) *Attorney, Agent, or Firm* — Oblon, McClelland, Maier & Neustadt, L.L.P

(57) ABSTRACT

A power supply path structure is provided for a flexible circuit board and includes a first flexible circuit board that includes at least one first connection pad and a first opposite connection pad and a first power supply path connected between the first connection pad and the first opposite connection pad and a second flexible circuit board that includes at least one second connection pad and a second opposite connection pad and a second power supply path connected between the second connection pad and the second opposite connection pad, and the first flexible circuit board is stacked, in a vertical direction, on the second flexible circuit board in such a way that the first power supply path and the second power supply path form a parallel-connected power supply path that serves as a power path or a grounding path for the first flexible circuit board.

11 Claims, 5 Drawing Sheets

(51) Int. Cl.
*H05K 3/28* (2006.01)
*C09K 19/20* (2006.01)
*C09K 19/30* (2006.01)
*C09K 19/32* (2006.01)
*C09K 19/38* (2006.01)
*H05K 1/02* (2006.01)
*H05K 1/03* (2006.01)
*C09K 19/12* (2006.01)

(52) U.S. Cl.
CPC ......... *C09K19/322* (2013.01); *C09K 19/3809* (2013.01); *H05K 1/0237* (2013.01); *H05K 1/0313* (2013.01); *H05K 3/281* (2013.01); *H05K 3/4611* (2013.01); *H05K 3/4635* (2013.01); *H05K 3/4688* (2013.01); *H05K 3/4691* (2013.01); *C09K 2019/122* (2013.01); *C09K 2219/03* (2013.01); *H05K 2201/0141* (2013.01); *H05K 2201/2063* (2013.01); *H05K 2203/06* (2013.01); *H05K 2203/12* (2013.01)

(56) References Cited

U.S. PATENT DOCUMENTS

| | | | |
|---|---|---|---|
| 6,274,242 B1 | 8/2001 | Onodera et al. | |
| 6,334,922 B1 | 1/2002 | Tanaka et al. | |
| 6,774,316 B1* | 8/2004 | Suzuki | H05K 3/4069 174/262 |
| 7,740,790 B2 | 6/2010 | Onodera et al. | |
| 2003/0082363 A1* | 5/2003 | Nakagiri | B32B 5/26 428/313.3 |
| 2003/0087077 A1* | 5/2003 | Samuels | B29B 13/10 428/292.1 |
| 2003/0178227 A1* | 9/2003 | Matsunaga | H05K 3/027 174/257 |
| 2006/0169485 A1* | 8/2006 | Kawaguchi | H05K 3/4691 174/254 |
| 2007/0077413 A1* | 4/2007 | Amou | B32B 5/26 428/323 |
| 2011/0240354 A1* | 10/2011 | Furuhata | H01L 21/568 174/258 |
| 2011/0284273 A1* | 11/2011 | Japp | H05K 3/4641 174/257 |
| 2011/0300307 A1* | 12/2011 | Nakai | H05K 3/0035 427/555 |
| 2012/0031649 A1* | 2/2012 | Antesberger | H05K 3/462 174/251 |
| 2012/0160544 A1* | 6/2012 | Antesberger | H05K 3/4623 174/251 |
| 2012/0160547 A1* | 6/2012 | Antesberger | H05K 3/462 174/255 |
| 2012/0247822 A1* | 10/2012 | Fuller, Jr. | H05K 1/162 174/260 |
| 2012/0281411 A1* | 11/2012 | Kajiya | F21K 9/135 362/249.02 |
| 2013/0056248 A1* | 3/2013 | Kajiya | H05K 1/028 174/254 |
| 2013/0062101 A1* | 3/2013 | Kanai | H05K 3/4069 174/251 |
| 2013/0168148 A1* | 7/2013 | Kanai | H05K 3/462 174/262 |
| 2014/0102771 A1* | 4/2014 | Kajiya | H05K 1/028 174/254 |
| 2014/0231123 A1 | 8/2014 | Onodera et al. | |

FOREIGN PATENT DOCUMENTS

| | | |
|---|---|---|
| JP | 2004-342686 | 12/2004 |
| JP | 2005-045187 | 2/2005 |
| JP | 2005-217078 | 2/2005 |
| JP | 2006-191145 | 7/2006 |
| JP | 2010-040934 | 2/2010 |
| JP | 2010-046914 | 3/2010 |
| JP | 2011-068713 | 4/2011 |
| JP | 2011-175988 | 9/2011 |
| JP | 2011-253958 | 12/2011 |
| WO | WO 97/47165 A1 | 12/1997 |

OTHER PUBLICATIONS

International Preliminary Report on Patentability and Written Opinion issued Apr. 2, 2015 in PCT/JP2013/074719 (submitting English translation only).

* cited by examiner

CIRCUIT BOARD AND METHOD FOR MANUFACTURING SAME

CROSS REFERENCE TO THE RELATED APPLICATION

This application is a continuation application, under 35 U.S.C. §111(a), of international application No. PCT/JP2013/074719, filed Sep. 12, 2013, which claims priority to Japanese Patent Application No. 2012-206412, filed on Sep. 20, 2012, Japanese Patent Application Nos. 2012-230734 and 2012-230735, both filed on Oct. 18, 2012, and Japanese Patent Application No. 2013-002507, filed on Jan. 10, 2013, the entire disclosure of each of which is herein incorporated by reference as a part of this application.

FIELD OF THE INVENTION

The present invention relates to a circuit board at least comprising a liquid crystal polymer film comprising a thermoplastic polymer capable of forming an optically anisotropic melt phase (hereinafter sometimes referred to as a thermoplastic liquid crystal polymer film) and an adhesive layer comprising a polyphenylene ether-based resin, the circuit board capable of being formed (molded or laminated) at a low temperature while employing a thermoplastic liquid crystal polymer film, and relates to a method for manufacturing the same.

BACKGROUND ART

In recent years, there have been remarkable developments in the field of information processing, such as personal computers, as well as in the field wireless communication, such as mobile phones. In these fields, improvement in information processing speed requires for circuit boards to increase propagation speed and reduce transmission loss at high frequency ranges. In general, circuit boards are produced by impregnating a glass cloth with an epoxy resin having a low dielectric constant to obtain an insulating layer; piercing through the insulating layer from top side to bottom side by drilling or laser irradiation to form a through-hole, followed by copper-plating to make an electrical pathway; patterning the surface thereof to form a wiring substrate; and further laminating a plurality of wiring substrates together as a multilayer circuit, and/or covering the wiring substrate or the multilayer circuits with a coverlay having an insulating property.

Conventionally, development in communication equipment using radio waves, such as mobile phones, wireless LANs, devices for determining inter-vehicle distance, has promoted use of communication signals in higher frequency ranges, as well as miniaturization of devices, in particular along with information of large capacity and high-speed.

The circuit boards for such communication equipment used in a high frequency range require insulating materials having a low dielectric constant and a low dielectric loss tangent. In addition, from the viewpoint of solder heat resistance, substrates comprising a fluorocarbon resin, a BT (bismaleimide-triazine) resin or the like have been used as a base material.

Further, thermoplastic liquid crystal polymer films have come to be used from the viewpoint of heat resistance, dimensional stability, good interlayer adhesion in a multilayer structure, low water absorption, and low transmission loss. The thermoplastic liquid crystal polymer films, however, cannot to be molded by using equipment for multilayer production conventionally used for thermosetting resins because the thermoplastic liquid crystal polymer films require to be heat-treated at a temperature of 250° C. or higher in multilayer lamination process, resulting in requirement for new equipment investment.

Furthermore, films used as coverlay require insulation property, heat resistance, and dimensional stability. For example, a polyimide film is used as a coverlay via adhesive to constitute a flexible circuit board; while rigid circuits use solder resist ink. In recent years, in order to reduce transmission loss in high frequency band, a method of using a thermoplastic liquid crystal polymer film as a coverlay has come to be proposed.

Under these circumstances, there have been disclosed multilayer laminates comprising a film made of a thermoplastic liquid crystal polymer being capable of forming an optically anisotropic melt phase, and a circuit layer(s) including an electrical wiring(s), both of which are bonded by thermal compression (for example, see Patent Documents 1 and 2). However, production of multilayer laminates disclosed in Patent Documents 1 and 2 requires molding at a high temperature as high as around the melting point of the thermoplastic liquid crystal polymer, which is much higher than 200° C. Accordingly, there is a problem that the specific press machine specialized in high temperature application must be used.

In order to solve the above problem, a multilayer wiring board has been proposed. The multilayer wiring board is produced by plasma treating the surface of a liquid crystal polymer film layer to enhance surface adhesion, thereafter forming a coating layer composed of a polyphenylene ether-based resin on the top and bottom surfaces of the liquid crystal polymer film layer (see, for example, Patent Document 3). However, the multilayer wiring board in Patent Document 3 is produced by covering the plasma-treated surfaces of the liquid crystal polymer film layer on top and bottom sides with polyphenylene ether-based covering layers followed by forming wiring circuits on each surface of the polyphenylene ether-based covering layers. As a result, the circuit board may have lowered dimensional stability and poor heat resistance after lamination. As another problem, the multilayer wiring board cannot be sufficiently resistant to high heat soldering.

There have been proposed a high-frequency circuit substrate having a low dielectric constant and a low dielectric loss tangent in high frequency ranges, as well as having excellent solder heat resistance and improved bonding to a conductor in intimate contact (see, for example, Patent Document 4). However, since the circuit substrate is formed of a thermoplastic resin composition containing a polyphenylene ether-based resin and a thermoplastic resin including a liquid crystal polymer so as to produce a film by melt-kneading the thermoplastic resin composition with an inorganic filler and additional constituents, followed by extruding the melt-kneaded resultant to form a film, the film has ununiform dielectric loss tangent and dielectric constant depending on the alloy state and dispersion state of the individual resins. As a result, the circuit substrate has problems of not only ununiform transmission loss, but also poor solder heat resistance and dimensional stability after lamination.

Furthermore, a coverlay film having a low dielectric constant and a low dielectric loss tangent has been proposed for the purpose of reducing transmission loss in high frequency (for example, see Patent Document 5). Patent Document 5 proposes a film formed from a vinyl compound, a polystyrene-poly(ethylene/butylene) block copolymer, an epoxy resin, and a curing catalyst. The film is excellent in electrical characteristics in high frequency, but has a problem that the film does not have satisfactory solder heat resistance as a circuit substrate.

Moreover, a high-frequency circuit board has been proposed (see, for example, Patent Document 6). The high-frequency circuit board has a low dielectric constant and a low dielectric loss tangent at high frequency region, as well as is excellent in solder heat resistance and bonding to a conductor in intimate contact. However, in a thermoplastic resin composition containing a polyphenylene ether-based resin and a thermoplastic resin including a liquid crystal polymer as a circuit material proposed by Patent Document 6, there has been a problem that the film is poor in solder heat resistance and dimensional stability after lamination.

Furthermore, the rapid development of electronic devices in recent years requires mounting of printed circuit boards with very high performance. As a way to meet these requirements, demand for rigid-flexible circuit boards has expanded. The rigid-flexible circuit board comprises a rigid board and a flexible board; both boards are laminated and integrated with each other. Such a rigid-flexible circuit board makes it possible to mount a component on a rigid part having rigidity comparable to rigid board as well as to achieve bendable solid interconnection at a flexible part having bendability. Accordingly, the rigid-flexible circuit board realizes miniaturization, weight reduction, portable application, and densification with respect to electronic device.

For example, Patent Document 7 describes a structure comprising a flexible part and a rigid part. The flexible part comprises a base film made of a heat-resistant resin such as a polyimide with metal conductors such as copper foils disposed on both surfaces of the base film, an acrylic adhesive, and a coverlay, wherein the base film with the metal conductors and the coverlay are successively laminated via the acrylic adhesive; the rigid part comprises one or more portions of the flexible part, a copper-clad laminate and a prepreg disposed therebetween, wherein the prepreg is obtained by impregnating a glass base material with an epoxy or others.

In order to meet requirements in high signal speed as well as high density, Patent Document 8 discloses a rigid-flexible circuit board comprising a flexible part made of a polyimide resin film to form a circuit layer, and a rigid part comprising a glass fiber base material and a polyimide resin film to be thermo-compression bonded to a portion of the flexible part. The polyimide resin film constituting the flexible part is covered with a covering layer via a thermosetting adhesive. This circuit board is excellent in bendability of the flexible part, and capable of meeting demand for high density by reducing thickness of the circuit board.

However, the polyimide films used in Patent Documents 7 and 8 have disadvantage that the polyimide is large in dielectric loss tangent and has high transmission loss although the polyimide films are used from the viewpoint of high heat resistance. As a result, noise easily occurs in the circuit boards when transmitting high-frequency signals.

RELATED ART DOCUMENTS

Patent Documents

[Patent Document 1] JP Laid-open Patent Publication No. 11-309803
[Patent Document 2] JP Patent Application No. 2005-217078
[Patent Document 3] JP Laid-open Patent Publication No. 2006-191145
[Patent Document 4] JP Laid-open Patent Publication No. 2011-253958
[Patent Document 5] JP Laid-open Patent Publication No. 2011-68713
[Patent Document 6] JP Laid-open Patent Publication No. 2011-253958
[Patent Document 7] JP Laid-open Patent Publication No. 7-94835
[Patent Document 8] JP Laid-open Patent Publication No. 2010-40934

SUMMARY OF THE INVENTION

Problems to be Solved by the Invention

An object of an aspect of the present invention is to provide a circuit board capable of being formed by low-temperature molding, while employing a thermoplastic liquid crystal polymer film having a high heat resistance, by combining the thermoplastic liquid crystal polymer film with an adhesive layer comprising a polyphenylene ether-based resin; and to provide a method to produce such a circuit board efficiently at low cost.

Means for Solving the Problems

The inventors of the present invention made an intensive study to achieve the above object and focused on a fact that (1) when a film of a liquid crystal polymer capable of forming an optically anisotropic melt phase (hereinafter may be referred to as a thermoplastic liquid crystal polymer film) excellent in dielectric characteristics in high frequency is used to constitute a circuit board, it is possible to improve electrical characteristics (for example, dielectric constant and dielectric loss tangent) of the circuit board. As a result of further study, the inventors found that (2) a circuit board comprising a circuit layer which comprises a thermoplastic liquid crystal polymer film and a conductive part such as a conductive wiring pattern adhered to the film, and/or a coverlay of a thermoplastic liquid crystal polymer film is not only excellent in heat resistance, but also capable of reducing transmission loss in high frequency because of excellent dielectric properties of the thermoplastic liquid crystal polymer film.

Based on the above findings, the inventors further studied and found that (3) a thermoplastic liquid crystal polymer film can be adhered to an adherend by thermal compression bonding using the thermoplastic property of the film, while the thermoplastic liquid crystal polymer film requires thermo-compression bonding at a temperature of around the melting point of the thermoplastic liquid crystal polymer, specifically a temperature much higher than 240° C. due to high heat resistance of the film to manufacture a circuit board. Consequently, the inventors found, as a new problem, that existing equipment carrying out thermal curing of a thermosetting resin by heating at a temperature of around 200° C. would be hardly usable for thermo-compression molding of the thermoplastic liquid crystal polymer.

The inventors made further investigation in order to solve this problem, and finally have found that (4) by using a thermoplastic liquid crystal polymer film in combination with an adhesive layer comprising a polyphenylene ether-based resin, and further by bonding them together so that the adhesive layer (or adhered layer) has a specific glass transition temperature, it is possible to manufacture a circuit board not only maintaining excellent dielectric properties required for a circuit board, but also producible by thermo-compression bonding of the liquid crystal polymer film at a low temperature using the existing equipment so as to obtain a circuit board having high heat resistance, resistance to solder heat, and low transmission loss. With these findings, the present inventors have accomplished the present invention.

That is, an aspect of the present invention includes a circuit board at least comprising:

a liquid crystal polymer film including a thermoplastic polymer capable of forming an optically anisotropic melt phase (hereinafter referred to as a thermoplastic liquid crystal polymer film) and an adhesive layer comprising a polyphenylene ether-based resin, wherein the thermoplastic liquid crystal polymer film constitutes at least one circuit board material selected from the group consisting of an insulating substrate (or a substrate layer), a circuit layer material (or an insulating material or substrate for circuit layer), and a coverlay, the thermoplastic liquid crystal polymer film is laminated to another circuit board material constituting the circuit board via the adhesive layer, and the adhesive layer (adhered layer) has a glass transition temperature of from 200° C. to 300° C.

In the circuit board, the adhesive layer may comprise the polyphenylene ether-based resin in a proportion of 10% by mass or greater.

In addition, the thermoplastic liquid crystal polymer film may have a melting point of 295° C. or higher.

The circuit board comprising an adhesive layer including a polyphenylene ether-based resin may have a tensile modulus of 2.0 GPa or higher.

The circuit board may comprise:

a circuit layer comprising a thermoplastic liquid crystal polymer film, and one or more conductive parts (for example, conductive wiring pattern) disposed on one surface or each surface of the film, wherein at least one surface of the circuit layer may be laminated to another circuit board material via the adhesive layer comprising the polyphenylene ether-based resin.

The circuit board may be a circuit board comprising:

a plurality of (at least two) circuit layers each comprising a thermoplastic liquid crystal polymer film and one or more conductive parts (for example, conductive wiring pattern) on one surface or each surface of the film, and the adhesive layer comprising the polyphenylene ether-based resin interposed between the circuit layers.

For example, in the circuit board comprising a circuit layer, the circuit layer may comprise a low profile conductive wiring pattern having a maximum surface roughness of 2.0 μm or lower.

The circuit board may be a circuit board comprising one or more circuit layers, and one or more adhesive layers.

Alternatively, the circuit board may be a circuit board comprising the thermoplastic liquid crystal polymer film as a coverlay to cover at least a portion of the conductive part via the adhesive layer comprising the polyphenylene ether-based resin.

The circuit board may have a solder heat resistant temperature of 295° C. or higher.

In addition, the circuit board may have, for example, an insertion loss at a frequency of 10 GHz of 3.0 dB/10 cm or less. The circuit board may have, for example, an insertion loss at a frequency of 5 GHz of 2.0 dB/10 cm or less.

Further, another aspect of the present invention includes a method for producing a circuit board at least comprising:

preparing an adhesive material sheet comprising a polyphenylene ether-based resin;

preparing a thermoplastic liquid crystal polymer film for constituting at least one circuit board material selected from the group consisting of an insulating substrate, a circuit layer material and a coverlay; and conducting thermo-compression bonding by placing the adhesive material sheet between one circuit board material comprising the thermoplastic liquid crystal polymer film and another circuit board material to obtain a layered material, followed by heat-treating the layered material under pressure at a heating temperature of from 150 to 250° C. so that the adhesive material sheet is formed into an adhesive layer having a glass transition temperature of from 200 to 300° C.

In the thermo-compression bonding, heating time may be from 30 seconds to 20 minutes.

In the production method, thermo-compression bonding may be conducted under a compression pressure of from 1 to 3 MPa.

Effect of the Invention

According to the present invention, not only by using an adhesive layer comprising a polyphenylene ether-based resin having a low dielectric constant in order to provide adhesion to a liquid crystal polymer film having a low dielectric constant, but also by allowing the adhesive layer to have a specific glass transition temperature, the adhesive layer can provide good adhesion to a circuit layer comprising one or more conductive parts (for example, conductive wiring pattern, in particular conductive wiring pattern having a low roughness) so as to produce a circuit board with a reduced transmission loss in high frequency of GHz band.

It should be noted that any combination of at least two constructions, disclosed in the appended claims and/or the specification and/or the accompanying drawings should be construed as included within the scope of the present invention. In particular, any combination of two or more of the appended claims should be equally construed as included within the scope of the present invention.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims.

DESCRIPTION OF EMBODIMENTS

Figure 1:
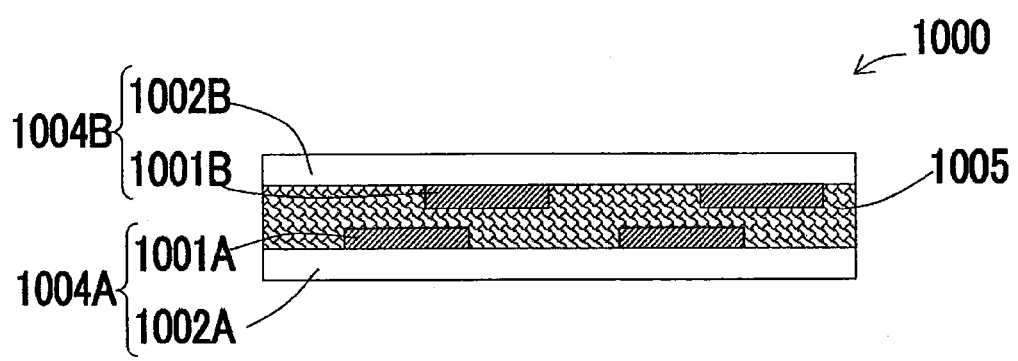
FIG. 1 is a schematic cross-sectional view showing a circuit board according to one embodiment of the present invention.

Now that a circuit board according to the present invention is illustrated.

The circuit board according to the present invention is a circuit board at least comprising:

a thermoplastic liquid crystal polymer film and an adhesive layer comprising a polyphenylene ether-based resin, wherein the thermoplastic liquid crystal polymer film constitutes at least one circuit board material selected from the group consisting of an insulating substrate, a circuit layer material, and a coverlay; and is laminated and integrated to another circuit board material constituting the circuit board via the adhesive layer.

As used herein, "circuit layer material" means a material for forming or constituting a circuit layer comprising an insulating substrate and one or more conductive parts, and illustratively means an insulating substrate and one or more conductive materials. Circuit board materials constituting the circuit board are not particularly limited to a specific one as long as they are members usable in usual circuit boards. Examples of circuit board materials may include an insulating substrate formed of an insulating material; a circuit layer comprising an insulating substrate and one or more conductive parts (conductive circuit, conductive wiring pattern and others) formed on at least one surface of the insulating substrate; a coverlay formed of an insulating material; and others.

The circuit board may be a monolayer circuit board having one conductive circuit layer, or a multilayer circuit board which comprises a plurality of conductive circuit layers (for example, 2 to 10 layers, preferably 2 to 8 layers) of at least in flexible part.

As one of the features of the present invention, there is mentioned that the adhesive layer in the circuit board has a glass transition temperature within a predetermined temperature range. This indicates that the adhesive layer providing adhesion in the circuit board has a glass transition temperature within a predetermined temperature range. Such an adhesive layer having a specific glass transition temperature can be obtained by, for example, applying heat to an adhesive material sheet comprising a polyphenylene ether-based resin under certain heating conditions.

That is, such an adhesive layer is very distinct from, for example, a heat-cured product in Patent Document 5 obtained by heating a polyphenylene ether-based resin for a long period to be completely cured. The adhesive layer according to the present invention can have a particular soft state defined by glass transition temperature even providing adhesion.

For example, the circuit board according to an embodiment of the present invention may be a circuit board including a circuit layer comprising a thermoplastic liquid crystal polymer film and one or more conductive parts (for example, conductive wiring pattern, conductive circuit) disposed on one surface or each surface of the film, wherein at least one surface of the circuit layer is laminated to another circuit board material via the adhesive layer.

In such a circuit board, the adhesive layer is disposed to contribute to lamination between (i) a circuit board material and (ii) an insulating substrate formed of an insulating material; between (i) a circuit board material and (ii) a circuit layer comprising an insulating substrate and a conductive part or layer formed on at least one surface of the insulating substrate; between (i) a circuit board material and (ii) a coverlay formed of an insulating material; or the like.

FIG. 1 is a schematic cross-sectional view for illustrating a circuit board comprising a circuit layer which includes an insulating substrate formed of a thermoplastic liquid crystal polymer film and a conductive wiring pattern formed on one surface thereof. At least one surface of the circuit layer is laminated to another circuit board material via an adhesive layer.

As shown in FIG. 1, a circuit board 1000 comprises at least a circuit layer 1004A which comprises an insulating substrate 1002A of a thermoplastic liquid crystal polymer film, and a conductive circuit (or conductive part) 1001A formed on one surface of the insulating substrate 1002A. The circuit layer 1004A is laminated to a circuit layer 1004B which is another circuit board material via an adhesive layer 1005 comprising a polyphenylene ether-based resin. The adhesive layer 1005 is disposed between the conductive circuit side of the circuit layer 1004A and the circuit layer 1004B. It should be noted that the circuit layer 1004B comprises a conductive circuit (conductive part) 1001B formed on one surface of the insulating substrate 1002B.

In this figure, each of the conductive circuits 1001A and 1001B is disposed on the either side of the adhesive layer such that the conductive circuits 1001A and 1001B face with each other. Alternatively, at least one of the conductive circuits 1001A and 1001B, for example, may be formed on the opposite side to the adhesive layer.

The insulating substrate 1002B constituting the circuit layer 1004B is not particularly limited to a specific one as long as it can be adhered via an adhesive layer 1005. The insulating substrate may be a thermoplastic liquid crystal polymer film from the viewpoint of heat resistance, dimensional stability, and low transmission loss property.

FIG. 1 shows a circuit board comprising two layers of conductive circuits 1001A and 1001B. In an alternative embodiment, the circuit board may be a monolayer circuit board comprising single layer of conductive circuit, or may be a multilayer circuit board comprising three or more layers of conductive circuit.

For example, in terms of high-density integration, the circuit board preferably may be a multilayer circuit board comprising a plurality of circuit layers (A), each of the circuit layers having conductive circuits on both sides of an insulating substrate. Preferable circuit boards include a four-layer circuit board represented by (A)/(B)/(A), where (A) is a circuit layer having conductive circuits on both sides and (B) is an adhesive layer. By repeated lamination, a six-layer circuit board structure (A)/(B)/(A)/(B)/(A), further an eight-layer circuit board structure (A)/(B)/(A)/(B)/(A)/(B)/(A) are also possible.

The circuit board according to another embodiment of the present invention may comprise a coverlay of a thermoplastic liquid crystal polymer film, the coverlay being capable of covering, via an adhesive layer comprising a polyphenylene ether-based resin, at least a portion of the conductive part (for example, conductive wiring pattern).

It should be noted that as long as a specific adhesive resin according to the present invention is used, it is not necessary that all of the insulating substrate material (for example, flexible insulating substrate material) and the coverlay in the circuit board are formed of thermoplastic liquid crystal polymer films. Depending on necessity, it is possible to select the various materials commonly used as insulating substrate materials and coverlays. Preferably, in view of heat resistance, dimensional stability, and low transmission loss, both insulating substrate material and coverlay may be thermoplastic liquid crystal polymer films.

Further, the circuit board according to the present invention may have a configuration in which each surface of the circuit layer (A) is covered with a liquid crystal polymer film as a coverlay (C) via an adhesive layer (B) comprising a polyphenylene ether-based resin. Preferred configuration includes coverlay (C)/adhesive layer (B)/circuit layer (A)/ adhesive layer (B)/coverlay (C) in many cases.

Figure 2:
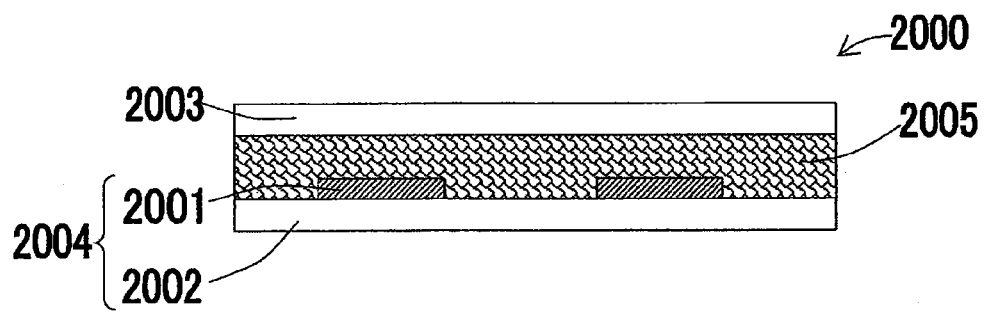
FIG. 2 is a schematic cross-sectional view showing a circuit board according to another embodiment of the present invention.

FIG. 2 is a schematic cross-sectional view illustrating a circuit board in which a coverlay of a thermoplastic liquid crystal polymer film is laminated to a circuit layer including a conductive wiring pattern via an adhesive layer including a polyphenylene ether-based resin.

As shown in FIG. 2, in a monolayer circuit board 2000, a conductive circuit 2001 is covered with a coverlay 2003 of a thermoplastic liquid crystal polymer film via an adhesive layer 2005 comprising a polyphenylene ether-based resin. Here, the conductive circuit 2001 is formed on an insulating substrate 2002 so as to form a circuit layer 2004. In other word, the coverlay 2003 is laminated to the circuit layer 2004.

There is no particular limitation as for the insulating substrate 2002 as long as the insulating substrate is bondable via the adhesive layer 2005. The insulating substrate may be a thermoplastic liquid crystal polymer film from the viewpoint of heat resistance, dimensional stability, and low transmission loss.

(Thermoplastic Liquid Crystal Polymer Film)

The thermoplastic liquid crystal polymer film may be used as an insulating substrate, or may be used as a coverlay.

The thermoplastic liquid crystal polymer film according to the present invention is formed from a liquid crystalline polymer (or a thermoplastic polymer capable of forming an optically anisotropic melt phase) processable in a molten state. Chemical formulation of the thermoplastic liquid crystal polymer is not particularly limited to a specific one as long as it is a liquid crystalline polymer that can be melt-processable, and examples thereof may include a thermoplastic liquid crystal polyester, or a thermoplastic liquid crystal polyester amide obtained by introducing an amide bond thereto.

Furthermore, the thermoplastic liquid crystal polymer may be a polymer obtained by further introducing, to an aromatic polyester or an aromatic polyester amide, an imide bond, a carbonate bond, a carbodiimide bond, or an isocyanate-derived bond such as an isocyanurate bond.

Specific examples of the thermoplastic liquid crystal polymer used in the present invention may include known thermoplastic liquid crystal polyesters and thermoplastic liquid crystal polyester amides obtained from compounds classified as (1) to (4) as exemplified in the following, and derivatives thereof. However, it is needless to say that, in order to form a polymer capable of forming an optically anisotropic melt phase, there is a suitable range regarding the combination of various raw-material compounds.

(1) Aromatic or aliphatic dihydroxy compounds (see Table 1 for representative examples)

TABLE 1

Chemical structural formulae of representative examples of aromatic or aliphatic dihydroxyl compounds

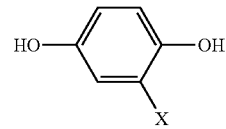

X represents a hydrogen atom or a halogen atom, or a group such as a lower alkyl (e.g., $C_{1-3}$ alkyl) or a phenyl

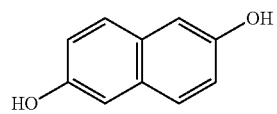

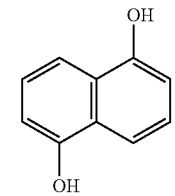 [SMILES: Oc1cccc2c(O)cccc12]

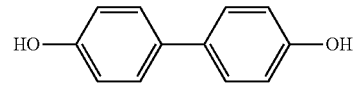 [SMILES: Oc1ccc(-c2ccc(O)cc2)cc1]

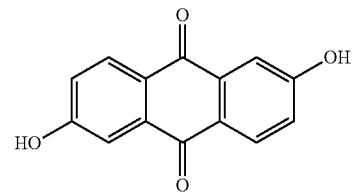 [SMILES: O=C1c2ccc(O)cc2C(=O)c2ccc(O)cc21]

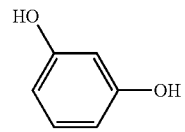

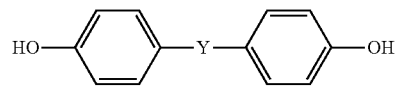

Y represents a group such as

—O—, —$CH_2$—, —S—,

—CO—, —$C(CH_3)_2$—, or —$SO_2$—

HO($CH_2$)$_n$OH n is an integer of 2 to 12

(2) Aromatic or Aliphatic Dicarboxylic Acids (See Table 2 for Representative Examples)

TABLE 2

Chemical structural formulae of representative examples of aromatic or aliphatic dicarboxylic acids

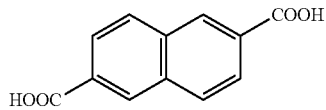 [SMILES: O=C(O)c1ccc2cc(C(=O)O)ccc2c1]

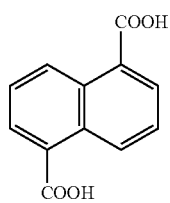 [SMILES: O=C(O)c1cccc2c(C(=O)O)cccc12]

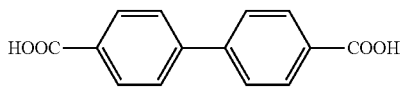

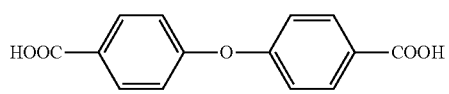 [SMILES: O=C(O)c1ccc(Sc2ccc(C(=O)O)cc2)cc1]

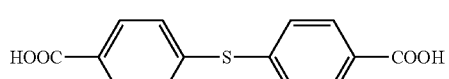

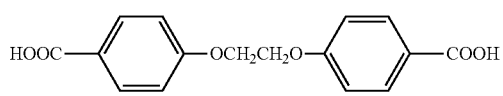

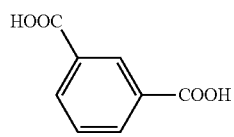

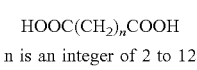

$HOOC(CH_2)_nCOOH$ n is an integer of 2 to 12

(3) Aromatic Hydroxycarboxylic Acids (See Table 3 for Representative Examples)

TABLE 3

Chemical structural formulae of representative examples of aromatic or aliphatic hydroxycarboxylic acids

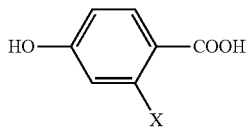

X represents a hydrogen atom or a halogen atom, or a group such as a lower alkyl (e.g., $C_{1-3}$ alkyl) or a phenyl

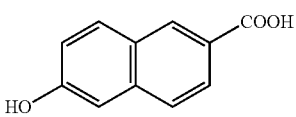 [SMILES: O=C(O)c1ccc2cc(O)ccc2c1]

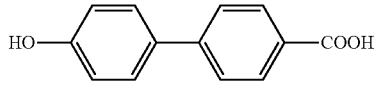

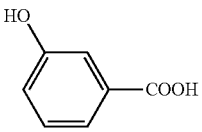

(4) Aromatic Diamines, Aromatic Hydroxy Amines, and Aromatic Aminocarboxylic Acids (See Table 4 for Representative Examples)

TABLE 4

Chemical structural formulae of representative examples of aromatic diamines, aromatic hydroxy amines, or aromatic aminocarboxylic acids

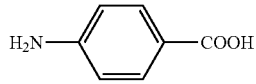

Representative examples of liquid crystal polymers obtained from these raw-material compounds may include copolymers having structural units shown in Tables 5 and 6.

TABLE 5

Representative examples (1) of a thermoplastic liquid crystal polymer

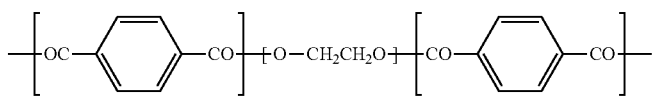

(A)

Copolymer

TABLE 5-continued
Representative examples (1) of a thermoplastic liquid crystal polymer
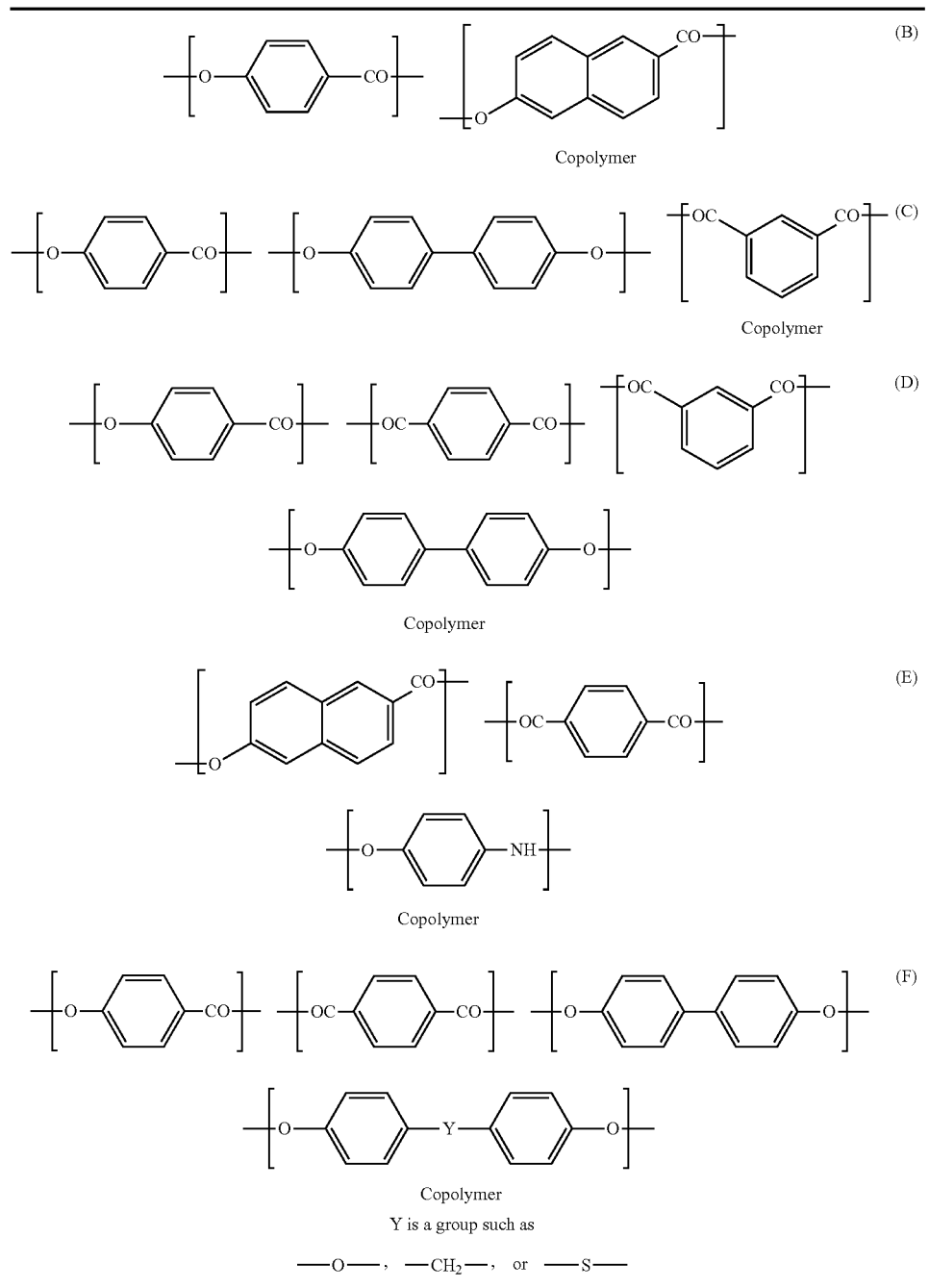
TABLE 6
Representative examples (2) of thermoplastic liquid crystal polymer
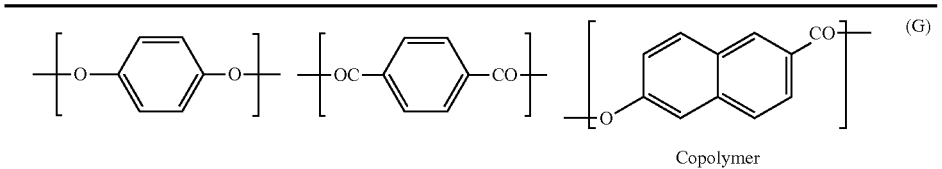

TABLE 6-continued

Representative examples (2) of thermoplastic liquid crystal polymer

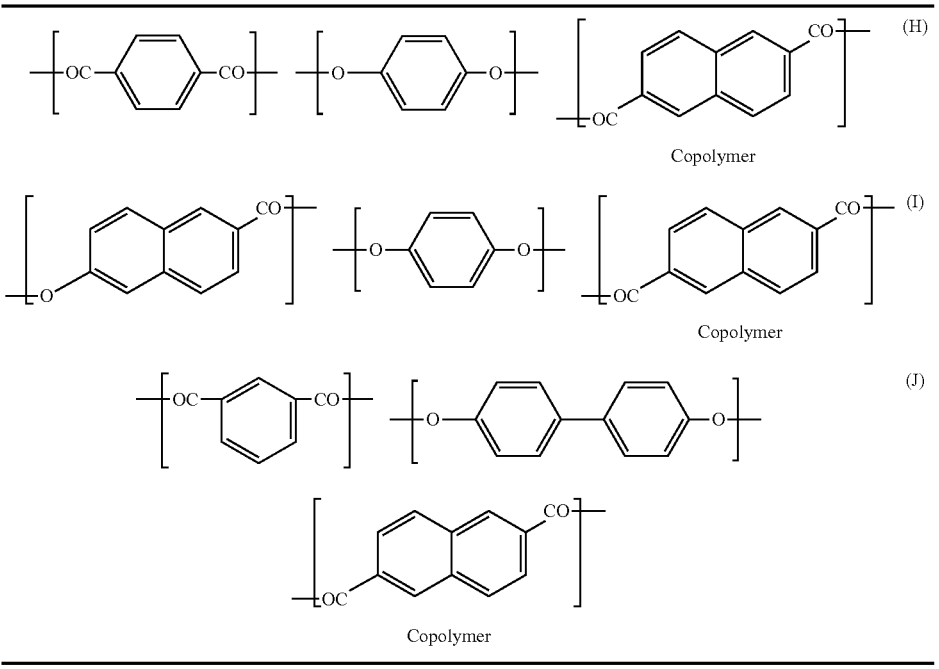

Of these copolymers, polymers including at least p-hydroxybenzoic acid and/or 6-hydroxy-2-naphthoic acid as repeating units are preferable; and particularly preferred polymers include:

a polymer (i) having repeating units of p-hydroxybenzoic acid and 6-hydroxy-2-naphthoic acid, and a polymer (ii) having repeating units of at least one aromatic hydroxycarboxylic acid selected from a group consisting of p-hydroxybenzoic acid and 6-hydroxy-2-naphthoic acid, at least one aromatic diol selected from a group consisting of 4,4'-dihydroxybiphenyl and hydroquinone, and at least one aromatic dicarboxylic acid selected from a group consisting of terephthalic acid, isophthalic acid, and 2,6-naphthalene dicarboxylic acid.

For example, in the case where the polymer (i) comprises a thermoplastic liquid crystal polymer having repeating units of at least p-hydroxybenzoic acid (A) and 6-hydroxy-2-naphthoic acid (B), the liquid crystal polymer may have a mole ratio (A)/(B) of preferably about (A)/(B)=10/90 to 90/10, more preferably about (A)/(B)=50/50 to 85/15, and further preferably about (A)/(B)=60/40 to 80/20.

Furthermore, in the case where the polymer (ii) comprises a liquid crystal polymer having repeating units of at least one aromatic hydroxycarboxylic acid (C) selected from a group consisting of p-hydroxybenzoic acid and 6-hydroxy-2-naphthoic acid, at least one aromatic diol (D) selected from a group consisting of 4,4'-dihydroxybiphenyl and hydroquinone, and at least one aromatic dicarboxylic acid (E) selected from a group consisting of terephthalic acid, isophthalic acid, and 2,6-naphthalene dicarboxylic acid, the liquid crystal polymer may have a mole ratio of aromatic hydroxycarboxylic acid (C):aromatic diol (D):aromatic dicarboxylic acid (E)=30 to 80:35 to 10:35 to 10, more preferably about (C):(D):(E)=35 to 75:32.5 to 12.5:32.5 to 12.5, and further preferably about (C):(D):(E)=40 to 70:30 to 15:30 to 15.

Furthermore, the liquid crystal polymer may have a mole ratio of a repeating structural unit derived from an aromatic diol relative to a repeating structural unit derived from an aromatic dicarboxylic acid of preferably (D)/(E)=95/100 to 100/95. Deviation from this range may tend to result in a low degree of polymerization and deterioration in mechanical strength.

It should be noted that, in the present invention, optical anisotropy in a molten state can be determined by, for example, placing a sample on a hot stage, heating the sample with an elevating temperature under nitrogen atmosphere, and observing light transmitted through the sample.

Preferable thermoplastic liquid crystal polymers include those having a melting point (hereinafter referred to as Tm) ranging of 295° C. or higher, and more preferably those having a Tm of from 310 to 400° C. It should be noted that Tm can be obtained by measuring a temperature at which a main endothermic peak appears using a differential scanning calorimeter (DSC produced by Shimadzu Corp).

As long as the advantageous effect of the present invention is not deteriorated, to the thermoplastic liquid crystal polymer, there may be added a thermoplastic polymer such as a polyethylene terephthalate, a modified polyethylene terephthalate, a polyolefin, a polycarbonate, a polyarylate, a polyamide, a polyphenylene sulfide, a polyether ether ketone, and a fluorocarbon resin; various additives; fillers; and the like.

The thermoplastic liquid crystal polymer film used in the present invention can be obtained by extruding a thermoplastic liquid crystal polymer. As long as it is possible to control the direction of rigid rod-like molecules of the thermoplastic liquid crystal polymer, any extrusion method such as T-die method, laminate-stretching method, and other well-known method may be applied. Among them, inflation method is particularly preferable.

The thermoplastic liquid crystal polymer film used in the present invention preferably has a melting point of 295° C.

or higher. In order for the polymer film to have such a high melting point, once obtained film having a low melting point may be heat-treated under inert atmosphere so as to increase the melting point of the film. If the melting point of the film is too low, there is a possibility that such a film may cause warps or dimensional changes in the reflow soldering process or at the time for soldering to join parts with lead-free solder. The thermoplastic liquid crystal polymer film used in the present invention preferably has a melting point of 310° C. or higher, and more preferably 330° C. or higher. Further, since a film having a melting point of exceeding 400° C. may require lamination equipment specialized in conducting thermo-compression bonding between the film and a copper foil at high temperatures in the process of producing a circuit layer, an upper limit of the melting point of the film may be about 400° C.

In the case of requiring a thermoplastic liquid crystal polymer film having a higher melting point and higher heat resistance, it is possible to increase the melting point and heat resistance of the film by conducting heat treatment on an already-obtained film. As an example of conditions for the heat treatment, if an already-obtained film has a melting point of 283° C., the film can increase its melting point by conducting heat treatment at a temperature of 260° C. for 5 hours so as to have a melting point of 320° C.

(Adhesive Layer or Adhesive Material Sheet Containing Polyphenylene Ether-Based Resin Layer)

The adhesive layer or the adhesive material sheet comprises at least a polyphenylene ether-based resin. The polyphenylene ether-based resin is substantially constituted from a unit represented by the following Chemical Formula 1.

Preferably the polyphenylene ether-based resin may have a curing property by introducing a functional group containing a carbon-carbon double bond, and/or a carbon-carbon triple bond as a side chain. In this case, the adhesive layer is obtained as a cured product of the adhesive material sheet.

Further, the polyphenylene ether-based resin can include a group of compounds represented by the following general formulae shown in Chemical Formula 2.

[Chemical Formula 1]

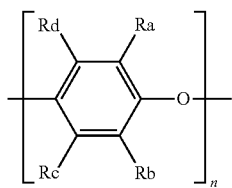

(1)

In the formula, Ra, Rb, Rc, and Rd may be the same or different, each representing hydrogen atom, a halogen atom,

[Chemical Formula 2]

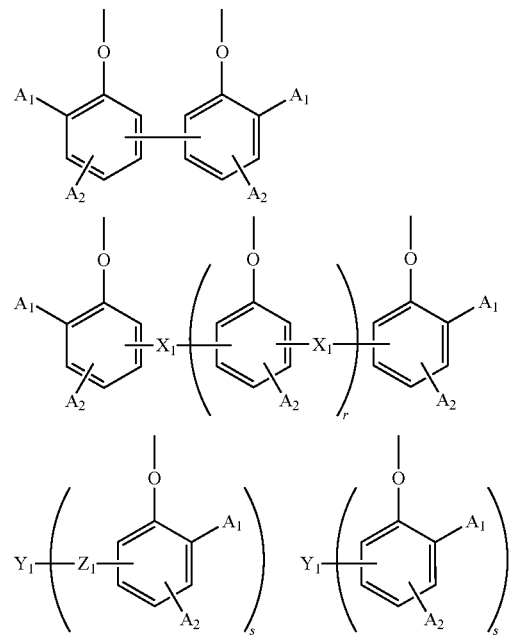

In the formula, $A_1$ and $A_2$ may be the same or different, each representing a linear alkyl group having 1 to 4 carbon atoms; $X_1$ represents an aliphatic hydrocarbon residue and a substituted derivative thereof, an aralkyl group and a substituted derivative thereof, oxygen atom, sulfur atom, sulfonyl group, or carbonyl group; $Y_1$ represents an aliphatic hydrocarbon residue and a substituted derivative thereof, an aromatic hydrocarbon residue and a substituted derivative thereof, or an aralkyl group and a substituted derivative thereof; $Z_1$ represents oxygen atom, sulfur atom, sulfonyl group, or carbonyl group; the position of $A_2$ and direct bonding between two phenyl groups, the position of $A_2$ and $X_1$, the position of $A_2$ and $Y_1$, and the position of $A_2$ and $Z_1$, are all in the bonding position of ortho- and para-position relative to the phenolic hydroxyl group; r represents from 0 to 4; and s represents from 2 to 6.

Further, in the case where the polyphenylene ether-based resin is a thermosetting polyphenylene ether-based resin, such a thermosetting polyphenylene ether-based resin may be substantially formed from the unit represented by the following general Chemical Formula (3)

[Chemical Formula 3]

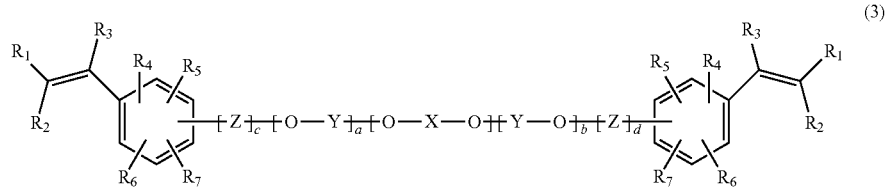

(3)

an alkyl group (for example, a $C_{1-4}$ alkyl group), a halogenated alkyl group (for example, a halogenated $C_{1-4}$ alkyl group) or phenyl group.

In the formula, $R_1$, $R_2$, $R_3$, $R_4$, $R_5$, $R_6$, and $R_7$, may be the same or different, each representing hydrogen atom, a halogen atom, an alkyl group, a halogenated alkyl group, or phenyl group; the unit —(O—X—O)— represents the following structural Chemical Formula (4); the unit —(Y—O)— represents the following structural Chemical Formula (5) singly or in combination of two or more which are randomly arranged; Z is an organic group having one or more carbon atoms, which may include oxygen atom, nitrogen atom, sulfur atom, and/or a halogen atom; a and b independently represent an integer from 0 to 300, at least one is not 0; c and d independently represent an integer of 0 or 1.

[Chemical Formula 4]

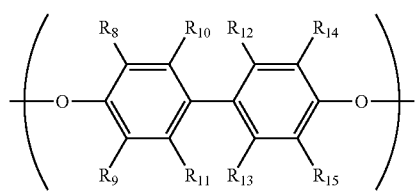

(4)

In the structural formula (4), $R_8$, $R_9$, $R_{10}$, $R_{14}$, and $R_{15}$ may be the same or different, each representing a halogen atom, phenyl group or an alkyl group having 6 or less carbon atoms; $R_{11}$, $R_{12}$, and $R_{13}$ may be the same or different, each representing hydrogen atom, a halogen atom, phenyl group or an alkyl group having 6 or less carbon atoms.

[Chemical Formula 5]

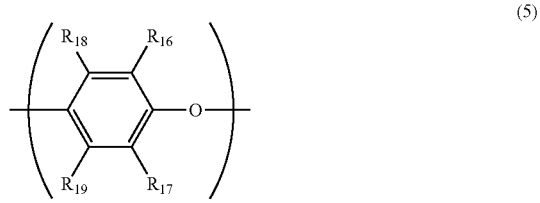

(5)

In the formula, $R_{16}$ and $R_{17}$ may be the same or different, each representing a halogen atom, an alkyl group having 6 or less carbon atoms, or phenyl group. $R_{18}$ and $R_{19}$ may be the same or different, each representing hydrogen atom, a halogen atom, an alkyl group having 6 or less carbon atoms, or phenyl group.

Such compounds are described in Japanese Laid-open Publication No. 2004-59644, for example, and available from Mitsubishi Gas Chemical Co., Ltd. as OPE-2st series.

Further in order to improve adhesion to thermoplastic liquid crystal polymer films, the adhesive layer may comprise a polyphenylene ether-based resin in combination with an elastomeric styrenic polymer. Examples of elastomeric styrenic polymers may include a styrenic thermoplastic elastomer such as a polystyrene-poly(ethylene/butylene) block-polystyrene copolymer (SEBS), a polystyrene-poly(ethylene/propylene) block-polystyrene copolymer (SEPS), a polystyrene-poly(ethylene-ethylene/propylene) block-polystyrene copolymer (SEEPS), or a hydrogenated products thereof (SEEPS-OH); a high-impact polystyrene comprising a mixture of a general-purpose polystyrene (GPPS) and a rubber component, or a hydrogenated products thereof, and the like.

For example, the adhesive layer or adhesive material sheet may comprise a polyphenylene ether-based resin, for example, in a proportion of at least 10% by mass (for example, 10 to 80 mass %) based on the entire weight of adhesive layer or adhesive material sheet, preferably 15 mass % or more (for example, 15 to 70 mass %), and particularly preferably 25 mass % or more.

Too small content of the polyphenylene ether-based resin may cause increased insertion loss. On the other hand, too large content of the polyphenylene ether-based resin may cause reduction in adhesive strength to the thermoplastic liquid crystal polymer film or poor dimensional stability after lamination.

Further, the adhesive layer or adhesive material sheet may comprise, for example, an elastomeric styrenic polymer, in a proportion of 90% by mass or less based on the entire weight of adhesive layer or adhesive material sheet, preferably 85 mass % or less (for example, 10 to 70 mass %), more preferably 75 mass % or less (for example, 20 to 60 mass %). Alternatively, the content may be preferably 30 to 80 mass %.

Further, the adhesive layer or adhesive material sheet may comprise a reactive resin in order to improve physical properties. Examples of reactive resins may include an acrylic resin, a novolac epoxy resin, a bisphenol A epoxy resin, a bisphenol F epoxy resin, and a biphenyl epoxy resin. For example, the proportion of the reactive resin may be 2% by mass or less and preferably 1.5 mass % or less based on the entire adhesive layer or adhesive material sheet.

The thickness of the adhesive material sheet used for bonding can be selected in the range of, for example, from 5 to 100 μm, more preferably in the range of from 5 to 50 μm.

(Material for Substrate or Coverlay)

The circuit board according to the present invention comprises a thermoplastic liquid crystal polymer film as at least one circuit board material selected from the group consisting of an insulating substrate, a circuit layer material, and a coverlay in the structure that the thermoplastic liquid crystal polymer film is laminated via an adhesive layer to another circuit board material constituting the circuit board. As long as the circuit board has the above mentioned structure, other members constituting the circuit board can be appropriately selected within a range that does not interfere with the effects of the invention.

For example, the material for insulating substrates (preferably flexible insulating substrates) and coverlays is preferably made of a thermoplastic liquid crystal polymer from the viewpoint dimensional stability, low moisture absorption, and low transmission loss. If necessary, it is also possible to use any high-frequency substrate materials other than thermoplastic liquid crystal polymers.

Such a high-frequency substrate material may be an organic material, or an inorganic material. Examples of organic materials may include as a flexible substrate material, for example, a polyimide film, and a cycloolefin polymer film; and as a rigid substrate material, a fluorocarbon resin, an epoxy resin, a phenolic resin, an acrylic resin, and others. It should be noted that the organic materials may be used alone or may be used in combination with a reinforcing material such as a glass fabric (for example, a glass mat, a woven glass cloth) as a glass epoxy substrate or a glass fluorocarbon substrate. Examples of inorganic materials may include a ceramic.

(Conductive Part)

The conductive part (conductive circuit or conductive wiring pattern) may be formed on at least one surface of an insulating substrate. The conductive part may constitute signal lines with a predetermined pattern, ground (earth), power supply surface or others. Such a conductive part may be formed by known or conventional methods such as sputtering method, plating method and others.

Alternatively, after adhering a conductor foil to an insulating substrate by known or conventional methods, signal lines with a predetermined pattern may be formed on one surface of the insulating substrate by photosensitive resist processing of the conductor surface, exposure to light, and etching away.

Depending on substrate materials, conductor foil can be bonded by thermal compression bonding directly to the substrate material. Alternatively, the conductive foil may be adhered to the substrate material via a suitable adhesive.

Preferable conductor materials include metals such as those used for electrical connection. Examples of conductor materials may include copper, gold, silver, nickel, and aluminum. Of these metals, copper is preferably used.

The thickness of the conductive part may be preferably in the range of from 1 to 50 μm, and more preferably in the range of from 5 to 20 μm. The surface of the metal layer used in the circuit layer or the conductive wiring pattern included in the circuit layer may preferably have a low roughness, such as a maximum surface roughness of 2.0 μm or less. In the case where the maximum roughness of the surface is larger than 2.0 μm, there is a possibility that the transmission loss may increase. The maximum roughness of the metal surface may be more preferably 1.5 μm or less, and still more preferably 1.0 μm or less.

For example, the circuit layer may be formed by heat-pressing a substrate material (preferably a thermoplastic liquid crystal polymer film) and an electrolytic or rolled copper foil having a surface roughness of 2.0 μm or less at a temperature of 30° C. lower than the melting point of the substrate material, and then etching with ferric chloride solution or the like to form a predetermined wiring. Further, in order to make an electrical pathway through the circuit layer, technologies for opening a through-hole or a via using a laser beam and copper-plating inner wall thereof can be used to form a circuit layer having an interlayer connection.

(Method of Producing Circuit Board)

Such a circuit board can be produced by a method at least comprising:

preparing an adhesive material sheet comprising a polyphenylene ether-based resin;

preparing a thermoplastic liquid crystal polymer film constituting at least one circuit board material selected from the group consisting of an insulating substrate, a circuit layer material and a coverlay; and conducting thermo-compression bonding by placing the adhesive material sheet between one circuit board material comprising the thermoplastic liquid crystal polymer film and another circuit board material to obtain a layered material, followed by heat-treating the layered material under pressure at a heating temperature of from 150 to 250° C. so that the adhesive material sheet is formed into an adhesive layer having a glass transition temperature of from 200 to 300° C.

The adhesive layer after thermo-compression bonding has a glass transition temperature of 200° C. or higher from the viewpoint of solder heat resistance and/or dimensional stability after lamination while having the flexibility. The glass transition temperature may be preferably 220° C. or higher, and further preferably 240° C. or higher. The upper limit of the glass transition temperature is 300° C. or lower, and may be preferably 280° C. or lower, and further preferably 270° C. or lower.

Further, it is preferable for the adhesive layer to be used while maintaining the flexibility. In the case where the circuit board has a laminated part comprising an adhesive layer providing adhesion between thermoplastic liquid crystal polymer films, the circuit board, for example as the laminated part thereof, may have an tensile modulus of, for example, 2.0 GPa or higher, preferably 2.5 GPa or higher, and more preferably 3.0 GPa or higher. The upper limit thereof may be approximately 5.0 GPa.

It should be noted that the tensile modulus of the circuit board shows a value measured by the method described in Examples below.

There is no particular restriction on heating and compressing devices used in the thermo-compression bonding process, and various devices such as a vacuum heating press, a roller heating press, a double-belt heating press, and others can be employed.

As long as the adhesive layer has a predetermined glass transition temperature, conditions for the thermo-compression bonding may be set appropriately depending on the kind of circuit board materials, and the blending ratio of each substance contained in the adhesive layer.

The heating temperature is from 150 to 250° C. (for example, about from 150 to 190° C.) from the viewpoint of conducting thermo-compression bonding without requiring high temperature, and may be preferably about from 160 to 230° C. (for example, about from 160 to 180° C.), and more preferably about from 170 to 200° C.

The lamination pressure may be, for example, about from 1 to 3 MPa, preferably about from 1.3 to 2.8 MPa, and more preferably about from 1.5 to 2.5 MPa.

The lamination time may be, for example, about from 30 seconds to 20 minutes, preferably about from 1 to 15 minutes, and more preferably about from 2 to 10 minutes.

[Circuit Board]

The circuit board according to the present invention may have an insertion loss of, at a frequency of 10 GHz, for example 3.0 dB/10 cm or less, preferably 2.5 dB/10 cm or less, and more preferably 2.0 dB/10 cm or less from the viewpoint of low transmission loss. Here, the insertion loss is a value measured by the method described in Examples below.

Further, the circuit board as described above may have an insertion loss of 2.0 dB/10 cm or less, preferably 1.8 dB/10 cm less, and more preferably 1.5 dB/10 cm or less at a frequency of 5 GHz.

The circuit board has excellent interlayer adhesion in the circuit board via a specific adhesive layer. For example, in the case where the interlayer adhesion is evaluated as an interlayer adhesion strength for peeling between a coverlay and a circuit layer adhered with an adhesive layer, or for peeling between adjacent circuit layers bonded via an adhesive layer, the interlayer adhesion strength may be, for example, 0.5 kN/m or greater and preferably 0.8 kN/m or greater. Here, the interlayer adhesion strength is a value measured by the method described in Examples below.

In addition, the circuit board also has excellent solder heat resistance. For example, heat resistance temperature to soldering (solder heat resistant temperature) of the circuit board (in particular, insulating substrate portion or coverlay portion) determined according to JIS C5016 test method may be, for example, 290° C. or higher, and preferably 295° C. or higher. Here, the heat resistance temperature to soldering is a value measured by the method described in Examples below.

Further, the circuit board also has excellent dimensional stability. The dimensional change ratio before and after heating the circuit board measured according to IPC-TM-6502.2.4 may be, for example, within a range of ±0.18%, preferably within a range off 0.13%, more preferably within a range of ±0.08%, and particularly preferably within a range of ±0.05%.

(Rigid-Flexible Circuit Board)

Further, as still another embodiment, the present invention may embrace a rigid-flexible circuit board comprising a rigid part and a flexible part.

The rigid-flexible circuit board may comprise a flexible part (flexible circuit board) comprising a thermoplastic liquid crystal polymer film having excellent dielectric characteristics in high frequency as an insulating substrate and coverlay material, and a rigid part comprising a rigid circuit layer laminated to one or more portions (sections) of the flexible circuit board. Thus obtained rigid-flexible circuit board is not only excellent in heat resistance but also has a reduced transmission loss in high frequency thanks to excellent dielectric properties of the thermoplastic liquid crystal polymer film.

For example, the rigid-flexible circuit board may be a rigid-flexible circuit board comprising:

a flexible part comprising a flexible circuit board including a thermoplastic liquid crystal polymer film capable of forming an optically anisotropic melt phase as at least one circuit board material selected from the group consisting of an insulating substrate, a circuit layer material, and a coverlay;

a rigid part comprising a rigid circuit board including a flexible circuit board portion extending from the flexible part, and a rigid circuit layer disposed to at least one surface of the flexible circuit board portion; and an adhesive layer disposed between the thermoplastic liquid crystal polymer film and another circuit board material constituting the rigid-flexible circuit board to be integrally laminated, the adhesive layer comprising a polyphenylene ether-based resin. It should be noted that the rigid circuit layer includes a rigid insulating substrate and one or more conductive parts (for example, conductive circuit) formed on at least one surface of the rigid insulating substrate.

Not only can the rigid-flexible circuit board be formed by low-temperature molding thanks to use of a specific adhesive layer, but the rigid-flexible circuit board also has heat resistance and excellent dimensional stability by using a thermoplastic liquid crystal polymer film as an insulating material of the flexible part. Further, the rigid-flexible circuit board is excellent in interlayer adhesion as well as can achieve low transmission loss.

Further, since the rigid-flexible circuit board according to the present invention can be formed by low-temperature molding, the rigid-flexible circuit board having the excellent properties described above can be manufactured efficiently by using lamination equipment and the like used for molding of thermosetting resins.

For example, the flexible part may comprise a flexible circuit board comprising:

a flexible circuit layer including a flexible insulating substrate formed of a thermoplastic liquid crystal polymer film and one or more conductive parts (for example, conductive circuit) formed on at least one side of the flexible insulating substrate, and a coverlay to cover the conductive part(s) of the flexible circuit layer.

The rigid part may comprise a rigid circuit board comprising:

one or more portions of the flexible circuit board, and one or more rigid circuit layer(s) disposed to at least one surface of the flexible circuit board portion(s), the rigid circuit layer(s) each including a rigid insulating substrate and one or more conductive parts (for example, conductive circuit) formed on at least one surface of the rigid insulating substrate.

The thermoplastic liquid crystal polymer film and another circuit board material constituting the rigid-flexible circuit board may be laminated via an adhesive layer comprising a polyphenylene ether-based resin.

For example, the flexible insulating substrate, the coverlay and the rigid insulating substrate may be bonded to each other via adhesive layers each comprising a polyphenylene ether-based resin.

The rigid insulating substrate may be formed of a thermoplastic liquid crystal polymer film or may be formed of an organic and/or inorganic substrate material described above.

Moreover, such a rigid-flexible circuit board can be produced by:

providing a thermoplastic liquid crystal polymer film as an insulating substrate material for forming a flexible part, providing an adhesive material sheet comprising a polyphenylene ether-based resin to bond the thermoplastic liquid crystal polymer film to at least one of other circuit board material(s) selected from the group consisting of an insulating substrate constituting the flexible part, an insulating substrate constituting the rigid part, a circuit layer, and a coverlay; and conducting thermo-compression bonding of the thermoplastic liquid crystal polymer film and the other circuit board material(s) to be integrally laminated.

Figure 3:
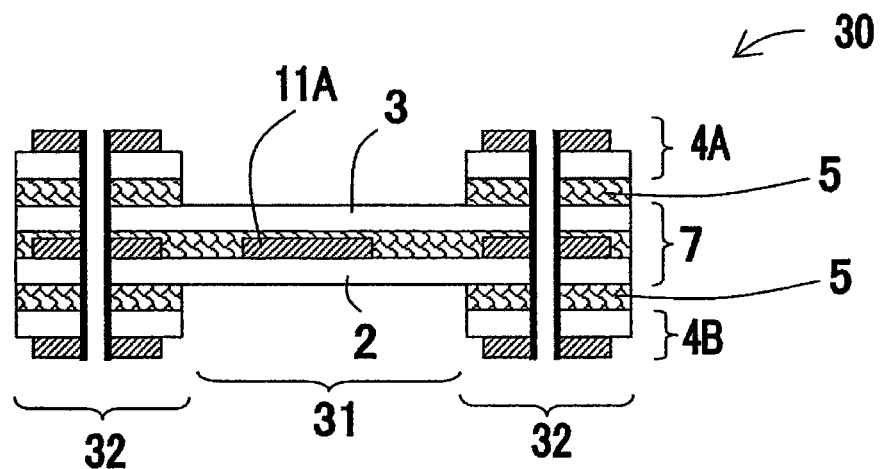
FIG. 3 is a schematic cross-sectional view showing a rigid-flexible circuit board according to still another embodiment of the present invention.
Figure 4:
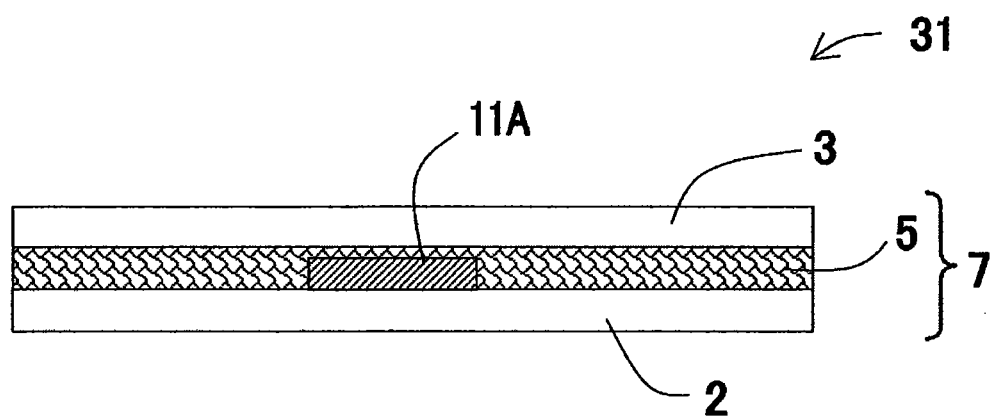
FIG. 4 is a schematic cross-sectional view showing a main part of the flexible part in the rigid-flexible circuit board in FIG. 3.
Figure 5:
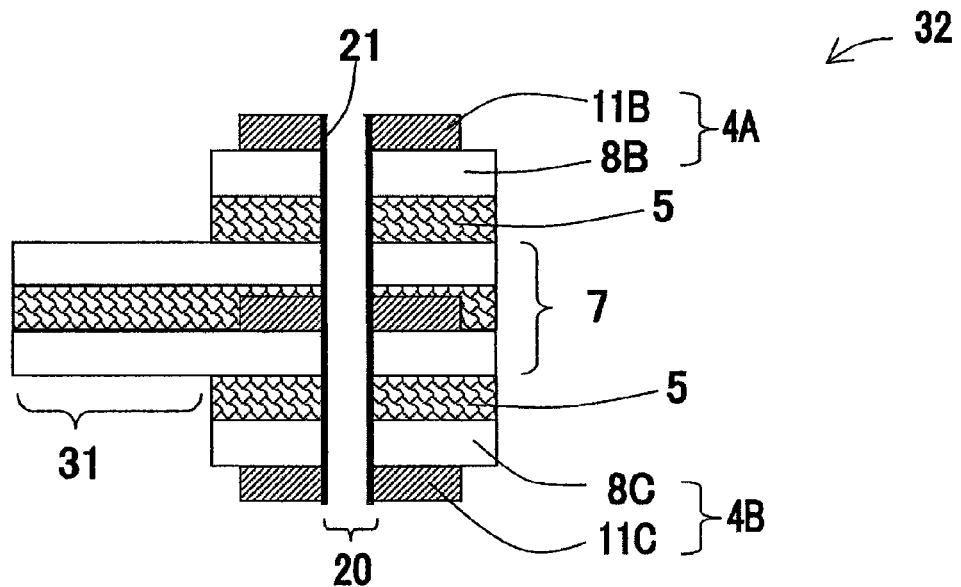
FIG. 5 is a schematic cross-sectional view showing a main part of the rigid part in the rigid-flexible circuit board in FIG. 3.

Specifically, a rigid-flexible circuit board is illustrated using FIGS. 3 to 5. FIG. 3 is a schematic cross-sectional view showing a rigid-flexible circuit board according to one embodiment of the present invention; FIG. 4 is a schematic cross-sectional view showing a main part of the flexible part thereof; and FIG. 5 is a schematic cross-sectional view showing a main part of the rigid part thereof.

As shown in FIG. 3, a rigid-flexible circuit board 30 comprises a flexible part 31 and rigid parts 32, 32. In each of the rigid parts 32, 32, rigid circuit layers 4A, 4B are formed, via the adhesive layers 5, 5 each comprising a polyphenylene ether-based resin, on both surfaces of the flexible circuit board 7 which extends from the flexible part 31, respectively.

As shown in FIG. 4, the flexible part 31 comprises a flexible circuit board 7 comprising a flexible circuit layer and a coverlay 3. The flexible circuit layer comprises a flexible insulating substrate 2 and a conductive part (conductive wire) 11A formed on one surface of the flexible insulating substrate. The coverlay 3 covers the conductive part 11A. Here both the flexible insulating substrate 2 and the coverlay 3 are each formed of a thermoplastic liquid crystal polymer capable of forming an optically anisotropic melt phase. The flexible insulating substrate 2 and the coverlay 3 are bonded to each other via an adhesive layer 5 including a polyphenylene ether-based resin.

As shown in FIG. 5, in the rigid part 32, the rigid circuit layers 4A, 4B are disposed and bonded, via the adhesive layers 5, 5 each comprising a polyphenylene ether-based resin, on both sides of the flexible circuit board 7 which extends from the flexible part 31, respectively. Here, the rigid circuit layers 4A, 4B comprise conductive parts (conductive circuits) 11B, 11C formed on the rigid insulating substrates 8B, 8C, respectively. Each of the rigid part 32 comprises a through-hole 20 piercing the rigid part 32 from the conductive part 11B to the conductive part 11C. The through-hole 20 has a through-hole plating 21 formed therein.

Figure 6:
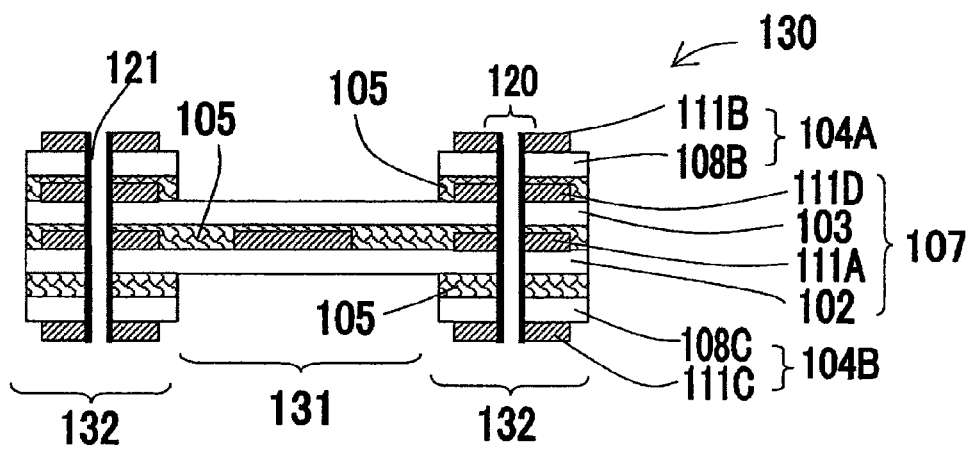
FIG. 6 is a schematic cross-sectional view showing a rigid-flexible circuit board according to another embodiment of the present invention.

FIG. 6 is a schematic cross-sectional view showing a rigid-flexible circuit board according to another embodiment of the present invention. The rigid-flexible circuit board 130 comprises a flexible part 131 and rigid parts 132, 132. The flexible part 131 is formed of a flexible circuit board 107. The flexible circuit board 107 comprises a flexible insulating substrate 102, a conductive part 111A disposed on one side of the flexible insulating substrate 102, and a coverlay 103 to cover the conductive part 111A. It should be noted that the coverlay 103 works as a coverlay in the flexible part 131, while in each of the rigid parts 132, 132, the coverlay 103 forms a conductive part 111D so as to function as a rigid part. Therefore, in such a case, the coverlay 103 in the rigid parts does not work as a coverlay, but substantially works as a part of a circuit layer having a conductive part. Nevertheless, that part is referred to as a coverlay based on the structure in the flexible part. It should be noted that this name "coverlay" is commonly used in other embodiments.

Each of the flexible insulating substrate 102 and the coverlay 103 is formed of a thermoplastic liquid crystal polymer. The flexible insulating substrate 102 and the coverlay 103 are bonded to each other via an adhesive layer 105 comprising a polyphenylene ether-based resin.

In each of the rigid parts 132, 132, rigid circuit layers 104A, 104B are disposed and bonded, via the adhesive layers 105, 105 each comprising a polyphenylene ether-based resin, on both sides of the flexible circuit board 107 extending from the flexible part 131, respectively. On the side of the rigid circuit layer 104A of the flexible circuit board 107, a conductive part 111D is provided. Here, the rigid circuit layers 104A, 104B comprise rigid insulating substrates 108B, 108C, and conductive parts (conductive circuits) 111B, 111C disposed on the rigid insulating substrate 108B, 108C, respectively. Each of the rigid part 132 comprises a through-hole 120 piercing the rigid part 132 from the conductive part 111B to the conductive part 111C. The through-hole 120 has a through-hole plating 121 formed therein.

Figure 7:
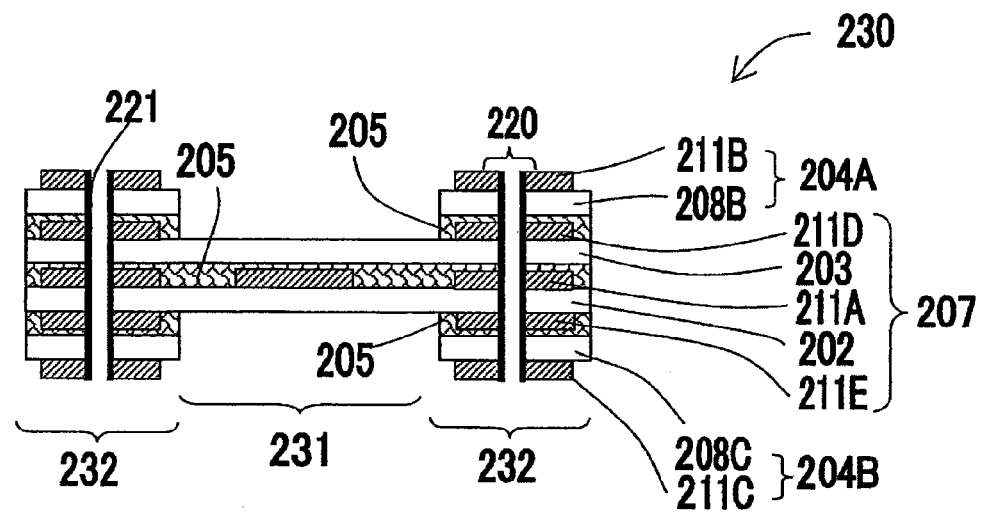
FIG. 7 is a schematic cross-sectional view showing a rigid-flexible circuit board according to still another embodiment of the present invention.

FIG. 7 is a schematic cross-sectional view showing a rigid-flexible circuit board according to still another embodiment of the present invention. The rigid-flexible circuit board 230 comprises a flexible part 231 and rigid parts 232, 232. As shown in FIG. 7, the flexible part 231 is formed of a flexible circuit board 207. The flexible circuit board 207 comprises a flexible insulating substrate 202, conductive parts 211A, 211E disposed on both surfaces the flexible insulating substrate 202, and a coverlay 203 to cover the conductive part 211A. It should be noted that the coverlay 203 works as a coverlay in the flexible part, while each of the rigid parts comprises the coverlay and a conductive part 211D disposed on the coverlay. Thus, the coverlay 203 in the rigid part substantially works as part of a circuit layer comprising a conductive part.

Each of the flexible insulating substrate 202 and the coverlay 203 is formed of a thermoplastic liquid crystal polymer. The flexible insulating substrate 202 and the coverlay 203 are bonded to each other via an adhesive layer 205 comprising a polyphenylene ether-based resin.

In each of the rigid parts 232, 232, rigid circuit layers 204A, 204B are disposed and bonded, via the adhesive layers 205, 205 each comprising a polyphenylene ether-based resin, on both sides of the flexible circuit board 207 extending from the flexible part 231, respectively. Each of the rigid parts 232, 232 comprising the flexible circuit board 207, and conductive parts 211D, 211E disposed on both sides of the flexible circuit board 207. Here, the rigid circuit layers 204A, 204B comprise rigid insulating substrates 208B, 208C, and conductive parts (conductive circuits) 211B, 211C disposed on the rigid insulating substrate 208B, 208C, respectively. Each of the rigid part 232 comprises a through-hole 220 piercing the rigid part 232 from the conductive part 211B to the conductive part 211C. The through-hole 220 has a through-hole plating 221 formed therein.

Figure 8:
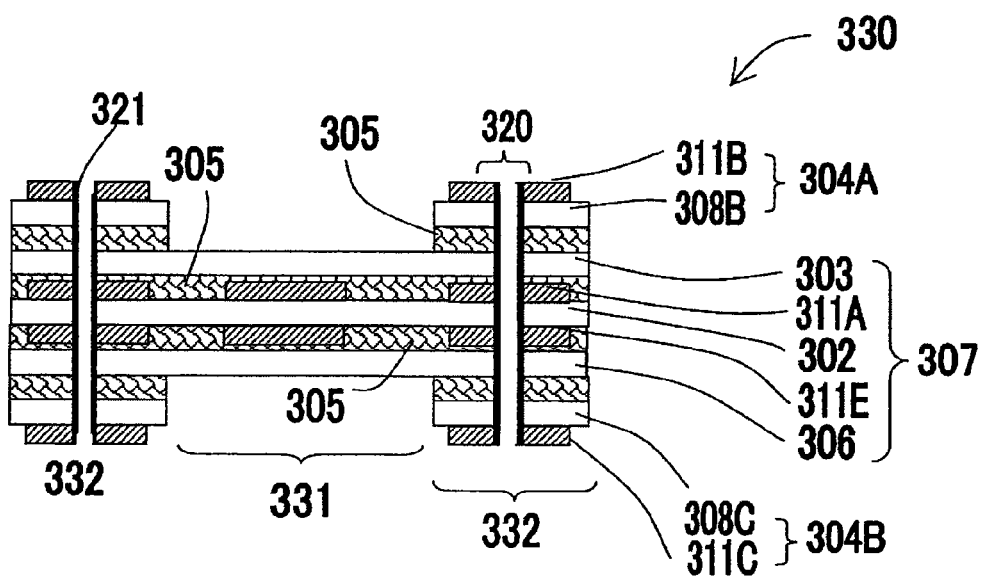
FIG. 8 is a schematic cross-sectional view showing a rigid-flexible circuit board according to still another embodiment of the present invention.

FIG. 8 is a schematic cross-sectional view showing a rigid-flexible circuit board according to still another embodiment of the present invention. The rigid-flexible circuit board 330 comprises a flexible part 331 and rigid parts 332, 332. As shown in FIG. 8, the flexible part 331 is formed of a flexible circuit board 307. The flexible circuit board 307 comprises a flexible insulating substrate 302, conductive parts 311A, 311E disposed on both sides of the flexible insulating substrate 302, and coverlays 303, 306 to covering the conductive parts 311A, 311E, respectively.

Each of the flexible insulating substrate 302 and the coverlays 303, 306 are formed of a thermoplastic liquid crystal polymer. The flexible insulating substrate 302 and the coverlay 303 as well as the substrate 302 and the coverlay 306 are bonded to each other via an adhesive layer 305 comprising a polyphenylene ether-based resin.

In each of the rigid parts 332, 332, rigid circuit layers 304A, 304B are disposed and bonded, via the adhesive layers 305, 305 each comprising a polyphenylene ether-based resin, on both sides of the flexible circuit board 307 extending from the flexible part 331, respectively. Here, the rigid circuit layers 304A, 304B comprise rigid insulating substrates 308B, 308C and conductive parts (conductive circuits) 311B, 311C on the rigid insulating substrates 308B, 308C, respectively. Each of the rigid part 332 comprises a through-hole 320 piercing the rigid part 332 from the conductive part 311B to the conductive part 311C. The through-hole 320 has a through-hole plating 321 formed therein.

Further, the thermoplastic liquid crystal polymer film used as a coverlay may have a melting point of same or different from that of the thermoplastic liquid crystal polymer film used as a flexible insulating substrate.

The thickness of the thermoplastic liquid crystal polymer films used as a flexible insulating substrate or a coverlay may be preferably in the range of from 1 to 100 μm, and more preferably within a range of from 5 to 50 μm.

(Rigid Substrate)

The rigid substrate may be formed of an organic material or an inorganic material as long as the rigid substrate can be used as a high frequency substrate material. Examples of organic materials may include a thermoplastic liquid crystal polymer sheet, and also may include a fluorocarbon resin, an epoxy resin, an acrylic resin, a thermoplastic liquid crystal polymer, and others. The organic material may be used singly or in combination with a reinforcing material such as a glass fabric (for example, a glass cloth, a glass textile). Examples of inorganic materials may include a ceramic.

The thickness of the rigid board can be set depending on the purpose of the rigid-flexible circuit board, and may be, for example, about from 0.5 to 2.5 mm, preferably about from 0.6 to 2.3 mm, and more preferably about from 0.7 to 2.1 mm. Further, if reduced thickness is required as a rigid layer, the rigid part may be formed of one or more thermoplastic liquid crystal polymer films as a flexible multilayer in the same manner as the flexible substrate. In this case, the rigid layer may be a single layer of a thermoplastic liquid crystal polymer film having a predetermined thickness. Alternatively, the rigid layer may comprise two or more layers (for example, about from 2 to 10 layers, preferably about from 2 to 5 layers) of a thin thermoplastic liquid crystal polymer film (for example, a thickness about from 200 μm to 1 mm) overlaid with each other and integrated so as to obtain a sheet like structure.

As modified embodiments, the present invention may also include application examples as described below.

APPLICATION EXAMPLE 1

A rigid-flexible circuit board comprising a flexible part and a rigid part, wherein
the flexible part comprises a flexible circuit board comprising a film of a thermoplastic liquid crystal polymer capable of forming an optically anisotropic melt phase (hereinafter referred to as a thermoplastic liquid crystal polymer) as an insulating material;
the rigid part comprises a rigid circuit board comprising:
one or more portions of the flexible circuit board, and
one or more rigid circuit layers disposed to at least on one surface of the flexible circuit board portion(s), the rigid circuit layer(s) each comprising a rigid insulating substrate and one or more conductive parts on at least one surface of the rigid insulating substrate; and
an adhesive layer comprising a polyphenylene ether-based resin to provide adhesion between the thermoplastic liquid crystal polymer films and between the flexible circuit board portion and the rigid circuit layer.

APPLICATION EXAMPLE 2

The rigid-flexible circuit board according to Application Example 1, wherein
the flexible part is formed of a flexible circuit board comprising:
a flexible insulating substrate formed of a thermoplastic liquid crystal polymer film,
one or more conductive parts disposed on at least one side of the flexible insulating substrate, and
one or more coverlays formed of a thermoplastic liquid crystal polymer film and covering the conductive part(s);
the rigid part comprises a rigid circuit board comprising:
one or more portions of the flexible circuit board, and
one or more rigid circuit layers disposed to at least on one surface of the flexible circuit board portion(s), the rigid circuit layer(s) each comprising a rigid insulating substrate and one or more conductive part formed on at least one side of the rigid insulating substrate; and
the adhesive layer comprising a polyphenylene ether-based resin to provide adhesion between two members selected from the group consisting of the flexible substrate, the rigid circuit layer, and the coverlay.

APPLICATION EXAMPLE 3

The rigid-flexible circuit board according to Application Example 1 or 2, wherein the thermoplastic liquid crystal polymer has a melting point of 295° C. or higher, and the adhesive layer has a glass transition temperature of 200° C. or higher.

APPLICATION EXAMPLE 4

The rigid-flexible circuit board according to any one of Application Examples 1 to 3, having a solder heat resistant temperature of 295° C. or higher.

APPLICATION EXAMPLE 5

The rigid-flexible circuit board according to any one of Application Examples 1 to 4, wherein the adhesive layer comprises a polyphenylene ether-based resin in a proportion of 10 mass % or greater.

APPLICATION EXAMPLE 6

The rigid-flexible circuit board according to any one of Application Examples 1 to 5, wherein the rigid insulating substrate comprises a thermoplastic liquid crystal polymer film.

APPLICATION EXAMPLE 7

The rigid-flexible circuit board according to Application Example 6, wherein the rigid insulating substrate comprises two or more layers of thermoplastic liquid crystal polymer films.

APPLICATION EXAMPLE 8

The rigid-flexible circuit board according to any one of Application Examples 1 to 7, wherein the rigid insulating substrate comprises a glass fluorocarbon substrate or a glass epoxy substrate.

APPLICATION EXAMPLE 9

A method of manufacturing a rigid-flexible circuit board comprising a flexible part and a rigid part, which comprises:
providing a thermoplastic liquid crystal polymer film as an insulating substrate material for forming the flexible part,
providing an adhesive material sheet comprising a polyphenylene ether-based resin for bonding at least one of other circuit board material(s) constituting the flexible part and the rigid part, and
conducting thermo-compression bonding between the thermoplastic liquid crystal polymer film and the other circuit board material(s) to be integrally laminated.

EXAMPLES

In the following, although the present invention will be described in more detail by means of Examples, the present invention is not limited to these Examples in any way.

[Melting Point of Film (° C.)]

Using a differential scanning calorimeter, a position of an endothermic peak that had appeared when temperature was raised at a rate of 10° C./min was recorded as a melting point of the film.

[Molecular Orientation Level (SOR)]

Using a microwave type molecular orientation meter, a liquid crystal polymer film is inserted into a microwave resonance waveguide tube such that a propagation direction of microwave is perpendicular to the film surface, and electric-field strength (microwave transmission intensity) of microwave transmitting through the film is measured.

Then, based on this measured value, m value (referred to as refractive index) is calculated from the following formula:

$$m=(Zo/\Delta z)\times[1-\nu max/\nu o]$$

Here, Zo represents a device constant, $\Delta z$ represents an average thickness of an object subjected to the measurement, νmax represents the frequency at which the maximum microwave transmission intensity can be obtained when the frequency of the microwave is varied, and νo represents the frequency at which the maximum microwave transmission intensity can be obtained when the average thickness is zero, that is, when no object is present.

Next, when the rotation angle of the object relative to the direction of oscillation of the microwaves is 0°, that is, when the direction of oscillation of the microwaves is aligned with the direction in which molecules of the object are most oriented as well as in which the minimum microwave transmission intensity is exhibited, an m value obtained in such a case was represented as $m_0$. An m value obtained as $m_{90}$ represents the value of the refractive index when the angle of rotation of the object is 90°. A molecular orientation level SOR is calculated as $m_0/m_{90}$.

[Heat Resistance to Soldering (° C.)]

According to JIS C5016, a circuit board with a coverlay was allowed to stand on a solder bath for one minute to measure the temperature of the solder bath at which changes in such as appearance discoloration, deformation, and foaming of the circuit board did not occur.

[Glass Transition Temperature of Adhesive Layer (° C.)]

Glass transition temperature of adhesive layer was measured by dynamic viscoelasticity measurement (DMA). A test piece (10 mm×40 mm) was cut out of a circuit board after thermo-compression bonding. As for the adhesive layer part of the test piece, the glass transition temperature was evaluated as a temperature at which peak tan D appeared in an elevating temperature of 3° C./min. from 25° C. to 220° C. using DMS6100.

[Tensile Modulus of Circuit Board]

Two sheets of thermoplastic liquid crystal polymer films (or two sheets of circuit layers each comprising a thermoplastic liquid crystal polymer film and a conductive part) are thermo-compressed to be bonded with each other via an adhesive layer comprising a polyphenylene ether-based resin to obtain a laminated part (for example, a flexible part of the circuit board). A test piece (10 mm×100 mm) cut out of the laminated part to measure tensile modulus according to ASTM D 882.

[Roughness of Conductive Wiring (μm)]

Roughness of the conductive wiring part was measured using a stylus-type surface roughness tester. Rz was measured according to JIS B0601-2001 using surface roughness tester ("Surftest SJ-201" produced by Mitutoyo Corp.).

[Interlayer Adhesion Strength (kN/m)]

According to JIS C5016, interlayer adhesion strength is evaluated as a bonding strength between two circuit board materials in which an adhesive layer comprising a polyphenylene ether-based resin was interposed (for example, between two flexible circuit layers or between a flexible circuit layer and a coverlay) by peeling the circuit board materials from each other at an angle of 90°.

[Insertion Loss at 5 GHz (dB/10 cm)]

A circuit board with a strip line structure in which signal line has a width of 95 μm and a longitudinal length of 100 mm was produced so as to have an impedance of 50 Ω.

Using microwave network analyzer ("8722ES" produced by Agilent Technology Co., Ltd.) and a probe ("ACP40-250" produced by Cascade Microtech Inc.), insertion loss of the circuit board at 5 GHz was measured.

[Insertion Loss at 10 GHz (dB/10 cm)]

A circuit board with a strip line structure in which signal line has a width of 140 μm and a longitudinal length of 100 mm was produced so as to have an impedance of 50 Ω.

Using microwave network analyzer ("8722ES" produced by Agilent Technology Co., Ltd.) and a probe ("ACP40-250" produced by Cascade Microtech Inc.), insertion loss of the circuit board at 10 GHz was measured.

[Dimensional Stability]

Dimensional stability of a sample was measured according to IPC-TM-6502.2.4. The sample was heated at 150° C. for 30 minutes to measure dimensional change ratio (%) of the sample before and after heating.

REFERENCE EXAMPLE A1

From a copolymerization product of p-hydroxybenzoic acid and 6-hydroxy-2-naphthoic acid (mole ratio: 73/27), a thermoplastic liquid crystal polymer film having a melting point of 280° C. and a film thickness of 50 μm was produced to be used as a base film. Heat treatment of the base film was carried out under nitrogen atmosphere for 4 hours at 260° C. and for another 2 hours at 280° C. so as to have an increased melting point of 300° C. Two sheets of rolled copper foils each having a predetermined surface roughness and a thickness of 12 μm were overlaid on both surfaces of the base film and bonded with each other using a continuous press machine having a pair of rollers under a condition of a roller temperature of 290° C., a line pressure of 100 kg/cm and a line speed of 2 m/min. to produce a copper-clad laminate (hereinafter referred to as copper-clad laminate A).

REFERENCE EXAMPLE A2

From a copolymerization product of p-hydroxybenzoic acid and 6-hydroxy-2-naphthoic acid (mole ratio: 73/27), a thermoplastic liquid crystal polymer film having a melting point of 280° C. and a film thickness of 50 μm was produced to be used as a base film. Heat treatment of the base film was carried out under nitrogen atmosphere for 4 hours at 260° C. and for another 4 hours at 280° C. so as to have an increased melting point of 330° C. Two sheets of rolled copper foils each having a predetermined surface roughness and a thickness of 12 μm were overlaid on both surfaces of the base film and bonded with each other using a continuous press machine having a pair of rollers under a condition of a roller temperature of 290° C., a line pressure of 100 kg/cm and a line speed of 2 m/min. to produce a copper-clad laminate (hereinafter referred to as copper-clad laminate B).

REFERENCE EXAMPLE A3

From a copolymerization product of p-hydroxybenzoic acid and 6-hydroxy-2-naphthoic acid (mole ratio: 73/27), a thermoplastic liquid crystal polymer film having a melting point of 280° C. and a film thickness of 50 μm was produced to be used as a base film. Heat treatment of the base film was carried out under nitrogen atmosphere for 4 hours at 260° C. and for another 7 hours at 280° C. so as to have a melting point of 370° C. Two sheets of rolled copper foils each having a predetermined surface roughness and a thickness of 12 μm were overlaid on both surfaces of the base film and bonded with each other using a continuous press machine having a pair of rollers under a condition of a roller temperature of 300° C., a line pressure of 100 kg/cm and a line speed of 2 m/min. to produce a copper-clad laminate (hereinafter referred to as copper-clad laminate C).

REFERENCE EXAMPLE A4

From a copolymerization product of p-hydroxybenzoic acid and 6-hydroxy-2-naphthoic acid (mole ratio: 73/27), a thermoplastic liquid crystal polymer film having a melting point of 280° C. and a film thickness of 50 μm was produced to be used as a base film. Two sheets of rolled copper foils each having a predetermined surface roughness and a thickness of 12 μm were overlaid on both surfaces of the base film and bonded with each other using a continuous press machine having a pair of rollers under a condition of a roller temperature of 260° C., a line pressure of 100 kg/cm and a line speed of 2 m/min. to produce a copper-clad laminate (hereinafter referred to as copper-clad laminate D).

EXAMPLE A1

The copper-clad laminate A obtained in Reference Example A1 was adjusted to have a copper roughness of 1.0 μm and processed to have a strip-line structure so as to obtain a wiring circuit layer. Into toluene were dissolved 50 parts by mass of thermosetting polyphenylene ether-based resin ("OPE2st" produced by Mitsubishi Gas Chemical Co., Ltd), 50 parts by mass of styrene-based polymer ("SEPTON8007L" produced by Kuraray Co., Ltd.), 1 part by mass of epoxy resin ("JER152" produced by Japan Epoxy Resins, Co., Ltd) and a curing accelerator, followed by drying and solidifying in a sheet to obtain an adhesive material sheet (thickness 25 μm). Thermo-compression bonding was conducted by disposing the wiring circuit layer and the adhesive material sheet overlaid under vacuum at a compression pressure of 2 MPa at 180° C. for 5 minutes to obtain a laminate article (circuit board) having a structure of circuit layer/adhesive layer/circuit layer. Physical properties of the obtained laminate article were evaluated to be shown in Table 7.

EXAMPLE A2

A wiring circuit layer was formed from a copper-clad laminate B obtained in Reference Example A2, adjusted to have a copper roughness of 1.0 μm, and processed to have a strip-line structure so as to obtain a wiring circuit layer. An adhesive material sheet was obtained in a manner similar to Example A1 except for changing the formulation of the thermosetting polyphenylene ether-based resin, the styrene-based polymer, and the epoxy resin into 30 parts by mass of the thermosetting polyphenylene ether-based resin, 70 parts by mass of the styrene-based polymer, and 1 part by mass of the epoxy resin. Thermo-compression bonding was conducted by disposing the wiring circuit layer and the adhesive material sheet overlaid under vacuum at a compression pressure of 2 MPa at 180° C. for 5 minutes to obtain a laminate article. Physical properties of the obtained laminate article were evaluated.

EXAMPLE A3

A wiring circuit layer was formed from a copper-clad laminate B obtained in Reference Example A2, adjusted to have a copper roughness of 0.5 μm, and processed to have a strip-line structure. Thermo-compression bonding was conducted by disposing the wiring circuit layer and the adhesive material sheet obtained in Example A1 overlaid under vacuum at a compression pressure of 2 MPa at 180° C. for 5 minutes to obtain a laminate article. Physical properties of the obtained laminate article were evaluated.

EXAMPLE A4

A wiring circuit layer was formed from a copper-clad laminate B obtained in Reference Example A2, adjusted to have a copper roughness of 2.0 μm, and processed to have a strip-line structure. An adhesive material sheet (adhesive layer (2)) was obtained in a manner similar to Example A1 except for changing the formulation of the thermosetting polyphenylene ether-based resin, the styrene-based polymer, and the epoxy resin into 60 parts by mass of the thermosetting polyphenylene ether-based resin, 40 parts by mass of the styrene-based polymer and 1 part by mass of the epoxy resin. Thermo-compression bonding was conducted by disposing the wiring circuit layer and the adhesive material sheet overlaid under vacuum at a compression pressure of 2 MPa at 180° C. for 5 minutes to obtain a laminate article. Physical properties of the obtained laminate article were evaluated.

EXAMPLE A5

A wiring circuit layer was formed from a copper-clad laminate C obtained in Reference Example A3, adjusted to have a copper roughness of 0.8 μm, and processed to have a strip-line structure. Thermo-compression bonding was conducted by disposing the wiring circuit layer and the adhesive material sheet obtained in Example A1 overlaid under vacuum at a compression pressure of 2 MPa at 180° C. for 5 minutes to obtain a laminate article. Physical properties of the obtained laminate article were evaluated.

EXAMPLE A6

A wiring circuit layer was formed from a copper-clad laminate C obtained in Reference Example A3, adjusted to have a copper roughness of 0.5 μm, and processed to have a strip-line structure. Thermo-compression bonding was conducted by disposing the wiring circuit layer and the adhesive material sheet obtained in Example A4 overlaid under vacuum at a compression pressure of 2 MPa at 180° C. for 5 minutes to obtain a laminate article. Physical properties of the obtained laminate article were evaluated.

EXAMPLE A7

A wiring circuit layer was formed from a copper-clad laminate D obtained in Reference Example A4, adjusted to have a copper roughness of 1.0 μm, and processed to have a strip-line structure. Thermo-compression bonding was conducted by disposing the wiring circuit layer and the adhesive material sheet obtained in Example A1 overlaid under vacuum at a compression pressure of 2 MPa at 180° C. for 5 minutes to obtain a laminate article. Physical properties of the obtained laminate article were evaluated.

EXAMPLE A8

A wiring circuit layer was formed from a copper-clad laminate B obtained in Reference Example A2, adjusted to have a copper roughness of 3.0 μm, and processed to have a strip-line structure. Thermo-compression bonding was conducted by disposing the wiring circuit layer and the adhesive material sheet obtained in Example A1 overlaid under vacuum at a compression pressure of 2 MPa at 180° C. for 5 minutes to obtain a laminate article. Physical properties of the obtained laminate article were evaluated.

EXAMPLE A9

A wiring circuit layer was formed from a copper-clad laminate B obtained in Reference Example A2, adjusted to have a copper roughness of 2.0 μm, and processed to have a strip-line structure. An adhesive material sheet was obtained in a manner similar to Example A1 except for changing the formulation of the thermosetting polyphenylene ether-based resin, the styrene-based polymer, and the epoxy resin into 10 parts by mass of the thermosetting polyphenylene ether-based resin, 90 parts by mass of the styrene-based polymer, and 1 part by mass of the epoxy resin. Thermo-compression bonding was conducted by disposing the wiring circuit layer and the adhesive material sheet overlaid under vacuum at a compression pressure of 2 MPa at 180° C. for 5 minutes to obtain a laminate article. Physical properties of the obtained laminate article were evaluated.

which was formed from a copolymerization product of p-hydroxybenzoic acid and 6-hydroxy-2-naphthoic acid (mole ratio: 73/27) was heat-treated under nitrogen atmosphere for 4 hours at 260° C. and for another 4 hours at 280° C. so as to have a melting point of 330° C. (hereinafter referred to as film B).

REFERENCE EXAMPLE B3

A base film C was obtained from a thermoplastic liquid crystal polymer film having a melting point of 280° C. and a film thickness of 25 μm, which was formed from a copolymerization product of p-hydroxybenzoic acid and 6-hydroxy-2-naphthoic acid (mole ratio: 73/27).

REFERENCE EXAMPLE B4

A thermoplastic liquid crystal polymer film having a melting point of 280° C. and a film thickness of 50 μm, which was formed from a copolymerization product of p-hydroxybenzoic acid and 6-hydroxy-2-naphthoic acid (mole ratio: 73/27) was heat-treated under nitrogen atmo-

TABLE 7

| | Circuit layer | | | Adhesive layer | | Circuit board | | |
|---|---|---|---|---|---|---|---|---|
| | Copper-clad laminate | Melting point (° C.) | Roughness of conductive wiring (μm) | Proportion of PPE polymer (%) | Glass transition temperature (° C.) | Tensile modulus (GPa) | Interlayer adhesion strength (kN/m) | Insertion loss (5 GHz) (dB/10 cm) |
| Example A1 | A | 300 | 1.0 | 50 | 230 | 2.5 | 1.0 | 1.3 |
| Example A2 | B | 330 | 1.0 | 30 | 200 | 3.0 | 1.0 | 1.5 |
| Example A3 | B | 330 | 0.5 | 50 | 230 | 3.0 | 0.9 | 1.1 |
| Example A4 | B | 330 | 2.0 | 60 | 238 | 3.0 | 1.5 | 1.1 |
| Example A5 | C | 370 | 0.8 | 50 | 230 | 3.5 | 1.2 | 1.1 |
| Example A6 | C | 370 | 0.5 | 60 | 238 | 3.5 | 1.0 | 1.0 |
| Example A7 | D | 280 | 1.0 | 50 | 230 | 2.0 | 0.4 | 1.3 |
| Example A8 | B | 330 | 3.0 | 50 | 230 | 3.0 | 1.7 | 4.0 |
| Example A9 | B | 330 | 2.0 | 10 | 170 | 3.0 | 1.2 | 2.4 |

It was possible for Examples A1 to A9 to be integrally laminated at a low molding temperature of 180° C., even if the thermoplastic liquid crystal polymer film constituted the circuit board material.

Of these Examples, Examples using the thermoplastic polymer film having a melting point of 300° C. or higher have tendencies to realize higher interlayer adhesion strength. Examples using the conductive wiring having a lower roughness have tendencies to realize a reduced insertion loss value. Further, Examples using the adhesive layer having a higher proportion of polyphenylene ether-based polymer have tendencies to have improved interlayer adhesion.

REFERENCE EXAMPLE B1

A thermoplastic liquid crystal polymer film having a melting point of 280° C. and a film thickness of 25 μm, which was formed from a copolymerization product of p-hydroxybenzoic acid and 6-hydroxy-2-naphthoic acid (mole ratio: 73/27) was heat-treated under nitrogen atmosphere for 4 hours at 260° C. and for another 2 hours at 280° C. so as to have a melting point of 300° C. (hereinafter referred to as film A).

REFERENCE EXAMPLE B2

A thermoplastic liquid crystal polymer film having a melting point of 280° C. and a film thickness of 25 μm, sphere for 4 hours at 260° C. and for another 4 hours at 280° C. so as to have a melting point of 330° C. Two sheets of rolled copper foils each having a predetermined surface roughness and a thickness of 12 μm were overlaid on both surfaces of the base film and bonded with each other using a continuous press machine having a pair of rollers under a condition of a roller temperature of 300° C., a line pressure of 100 kg/cm and a line speed of 2 m/min. to produce a copper-clad laminate. This copper-clad laminate underwent a wiring fabrication process to produce a wiring circuit layer.

EXAMPLE B1

Into toluene were dissolved 50 parts by mass of thermosetting polyphenylene ether-based resin ("OPE2st" produced by Mitsubishi Gas Chemical Co., Ltd), 50 parts by mass of styrene-based polymer ("SEPTON8007L" produced by Kuraray Co., Ltd.), 1 part by mass of epoxy resin ("JER152" produced by Japan Epoxy Resins, Co., Ltd) and a curing accelerator, followed by drying and solidifying in a sheet-like article to obtain an adhesive material sheet (thickness 25 μm). Thermo-compression bonding was conducted by disposing the film A obtained in Reference Example B1 and the adhesive material sheet overlaid under vacuum at a compression pressure of 2 MPa at 180° C. for 5 minutes to obtain a laminate article comprising a coverlay and the adhesive material sheet. Thereafter, the adhesive material sheet in the laminate article was disposed in contact with the wiring surface of the circuit layer obtained in Reference Example B4, followed by conducting thermo-compression bonding under vacuum at a compression pressure of 2 MPa at 180° C. for 5 minutes to obtain a circuit board in which the adhesive layer provided integrated adhesion between the coverlay and the circuit layer. Physical properties of the obtained circuit board were evaluated.

EXAMPLE B2

An adhesive material sheet was obtained in a manner similar to Example B1 except for changing the formulation of the thermosetting polyphenylene ether-based resin, the styrene-based polymer, and the epoxy resin into 30 parts by mass of the thermosetting polyphenylene ether-based resin, 70 parts by mass of the styrene-based polymer and 1 part by mass of the epoxy resin. Thermo-compression bonding was conducted by disposing the film B obtained in Reference Example B2 and the adhesive material sheet overlaid under vacuum at a compression pressure of 2 MPa at 180° C. for 5 minutes to obtain a laminate article comprising a coverlay and the adhesive material sheet. Thereafter, the adhesive material sheet in the laminate article was disposed in contact with the wiring surface of the circuit layer obtained in Reference Example B4, followed by conducting thermo-compression bonding under vacuum at a compression pressure of 2 MPa at 180° C. for 5 minutes to obtain a circuit board in which the coverlay and the circuit layer were integrated with the adhesive layer. Physical properties of the obtained circuit board were evaluated.

EXAMPLE B3

An adhesive material sheet was obtained in a manner similar to Example B1 except for changing the formulation of the thermosetting polyphenylene ether-based resin, the styrene-based polymer, and the epoxy resin into 20 parts by mass of the thermosetting polyphenylene ether-based resin, 80 parts by mass of the styrene-based polymer and 1 part by mass of the epoxy resin. Thermo-compression bonding was conducted by disposing the film B obtained in Reference Example B2 and the adhesive material sheet under vacuum at a compression pressure of 2 MPa at 180° C. for 5 minutes to obtain a laminate article comprising a coverlay and the adhesive material sheet. Thereafter, the adhesive material sheet in the laminate article was disposed in contact with the wiring surface of the circuit layer obtained in Reference Example B4, followed by conducting thermo-compression bonding under vacuum at a compression pressure of 2 MPa at 180° C. for 5 minutes to obtain a circuit board in which the adhesive layer provided integrated adhesion between the coverlay and the circuit layer. Physical properties of the obtained circuit board were evaluated.

EXAMPLE B4

An adhesive material sheet was obtained in a manner similar to Example B1 except for changing the formulation of the thermosetting polyphenylene ether-based resin, the styrene-based polymer, and the epoxy resin into 60 parts by mass of the thermosetting polyphenylene ether-based resin, 40 parts by mass of the styrene-based polymer and 1 part by mass of the epoxy resin. Thermo-compression bonding was conducted by disposing the film B obtained in Reference Example B2 and the adhesive material sheet overlaid under vacuum at a compression pressure of 2 MPa at 180° C. for 5 minutes to obtain a laminate article comprising a coverlay and the adhesive material sheet. Thereafter, the adhesive material sheet in the laminate article was disposed ins contact with the wiring surface of the circuit layer obtained in Reference Example B4, followed by conducting thermo-compression bonding under vacuum at a compression pressure of 2 MPa at 180° C. for 5 minutes to obtain a circuit board in which the adhesive layer provided integrated adhesion between the coverlay and the circuit layer. Physical properties of the obtained circuit board were evaluated.

EXAMPLE B5

Thermo-compression bonding was conducted by disposing the film C obtained in Reference Example B3 and the adhesive material sheet obtained in Example B1 overlaid under vacuum at a compression pressure of 2 MPa at 180° C. for 5 minutes to obtain a laminate article comprising a coverlay and the adhesive material sheet. Thereafter, the adhesive material sheet in the laminate article was disposed in contact with the wiring surface of the circuit layer obtained in Reference Example B4, followed by conducting thermo-compression bonding under vacuum at a compression pressure of 2 MPa at 180° C. for 5 minutes to obtain a circuit board in which the adhesive layer provided integrated adhesion between the coverlay and the circuit layer. Physical properties of the obtained circuit board were evaluated.

EXAMPLE B6

An adhesive material sheet was obtained in a manner similar to Example B1 except for changing the formulation of the thermosetting polyphenylene ether-based resin, the styrene-based polymer, and the epoxy resin into 10 parts by mass of the thermosetting polyphenylene ether-based resin, 90 parts by mass of the styrene-based polymer and 1 part by mass of the epoxy resin. Thermo-compression bonding was conducted by disposing the film B obtained in Reference Example B2 and the adhesive material sheet overlaid under vacuum at a compression pressure of 2 MPa at 180° C. for 5 minutes to obtain a laminate article comprising a coverlay and the adhesive material sheet. Thereafter, the adhesive material sheet in the laminate article was disposed in contact with the wiring surface of the circuit layer obtained in Reference Example B4, followed by conducting thermo-compression bonding under vacuum at a compression pressure of 2 MPa at 180° C. for 5 minutes to obtain a circuit board in which the adhesive layer provided integrated adhesion between the coverlay and the circuit layer. Physical properties of the obtained circuit board were evaluated.

COMPARATIVE EXAMPLE B1

A polyimide film having a thickness of 12.5 μm ("Kapton" produced by Toray-Du Pont Co., Ltd.) and an epoxy type adhesive having a thickness of 12.5 μm ("CISV" produced by NIKKAN INDUSTRIES Co., Ltd.) were provided as a coverlay and an adhesive material, respectively. Thereafter, the adhering material was disposed in contact with the wiring surface of the circuit layer obtained in Reference Example B4, followed by conducting thermo-compression bonding under vacuum at a compression pressure of 2 MPa at 180° C. for 5 minutes to obtain a circuit board in which the adhesive layer provided integrated adhesion between the coverlay and the circuit layer. Physical properties of the obtained circuit board were evaluated.

TABLE 8

| | Coverlay | | Adhesive layer | | | Circuit board | | |
|---|---|---|---|---|---|---|---|---|
| | Film | Meting point (° C.) | Proportion of PPE polymer (%) | Glass transition temperature (° C.)) | Tensile modulus (GPa) | Resistance temperature to soldering (° C.) | Interlayer adhesion strength (kN/m) | Insertion loss (10 GHz) (dB/10 cm) |
| Example B1 | A | 300 | 50 | 230 | 2.5 | 300 | 1.0 | 2.6 |
| Example B2 | B | 330 | 30 | 200 | 3.0 | 310 | 1.1 | 2.7 |
| Example B3 | B | 330 | 20 | 185 | 3.0 | 320 | 1.0 | 2.8 |
| Example B4 | B | 330 | 60 | 238 | 3.0 | 300 | 1.5 | 2.5 |
| Example B5 | C | 280 | 50 | 230 | 3.5 | 280 | 0.4 | 2.6 |
| Example B6 | B | 330 | 10 | 170 | 3.0 | 310 | 1.2 | 3.2 |
| Comparative Example B1 | Polyimide | None | None | — | 2.0 | 290 | 1.0 | 6.4 |

It was possible for Examples B1 to B6 to be integrally laminated at a low temperature of 180° C., even if the thermoplastic liquid crystal polymer film constituted the circuit board material.

Of these Examples, Examples using the thermoplastic polymer film having a melting point of 300° C. or higher have tendencies to realize a higher interlayer adhesion. Examples using the conductive wiring having a lower roughness have tendencies to realize a reduced insertion loss value. Further, Examples using the adhesive layer having a higher proportion of polyphenylene ether-based polymer have tendencies to have improved interlayer adhesion.

On the other hand, Comparative Example B1 using an adhesive layer of epoxy resin to adhere the polyimide could not reduce transmission loss in the high frequency because of the high value of insertion loss.

REFERENCE EXAMPLE C1

A thermoplastic liquid crystal polymer film having a melting point of 280° C., a film thickness of 25 μm, an SOR of 1.05 and a dielectric constant of 3.0 was formed from a copolymerization product of p-hydroxybenzoic acid and 6-hydroxy-2-naphthoic acid (mole ratio: 73/27) by melt extrusion and inflation molding.

REFERENCE EXAMPLE C2

A thermoplastic liquid crystal polymer film (A) obtained in Reference Example C1 was heat-treated under nitrogen atmosphere for 4 hours at 260° C. and for another 4 hours at 280° C. to produce a thermoplastic liquid crystal polymer film having a melting point of 330° C., a film thickness of 25 μm, an SOR 1.05 and a dielectric constant of 3.0.

REFERENCE EXAMPLE C3

A sheet of rolled copper foil having a maximum surface roughness of 1.0 μm and a thickness of 12 μm was overlaid on one surface of the thermoplastic liquid crystal polymer film obtained in Reference Example C1 and thermo-compression bonded with each other using a continuous press machine having a pair of rollers under a condition of a roller temperature of 280° C., a line pressure of 100 kg/cm and a line speed of 2 m/min. to produce a one surface copper-clad laminate. This copper-clad laminate was processed for wiring to obtain flexible boards 102 and 103 each having a melting point of 280° C.

REFERENCE EXAMPLE C4

A sheet of rolled copper foil having a maximum surface roughness of 1.0 μm and a thickness of 12 μm was overlaid on one surface of the thermoplastic liquid crystal polymer film obtained in Reference Example C2 and bonded with each other using a continuous press machine having a pair of rollers under a condition of a roller temperature of 300° C., a line pressure of 100 kg/cm and a line speed of 2 m/min. to produce a one surface copper-clad laminate. This copper-clad laminate was processed for wiring to obtain flexible board 102 and 103 each having a melting point of 330° C.

REFERENCE EXAMPLE C5

A sheet of rolled copper foil having a maximum surface roughness of 1.0 μm and a thickness of 12 μm was overlaid on one surface of the thermoplastic liquid crystal polymer film obtained in Reference Example C2 and bonded with each other using a continuous press machine having a pair of rollers under a condition of a roller temperature of 300° C., a line pressure of 100 kg/cm and a line speed of 2 m/min. to produce a one surface copper-clad laminate. This copper-clad laminate was processed for wiring to obtain a rigid board 104.

EXAMPLE C1

Into toluene were dissolved 50 parts by mass of thermosetting polyphenylene ether-based resin ("OPE2st" produced by Mitsubishi Gas Chemical Co., Ltd), 50 parts by mass of styrene-based polymer ("SEPTON8007L" produced by Kuraray Co., Ltd.), 1 part by mass of epoxy resin ("JER152" produced by Japan Epoxy Resins, Co., Ltd) and a curing accelerator, followed by drying and solidifying in a sheet to obtain an adhesive material sheet (thickness 25 μm).

Figure 9:
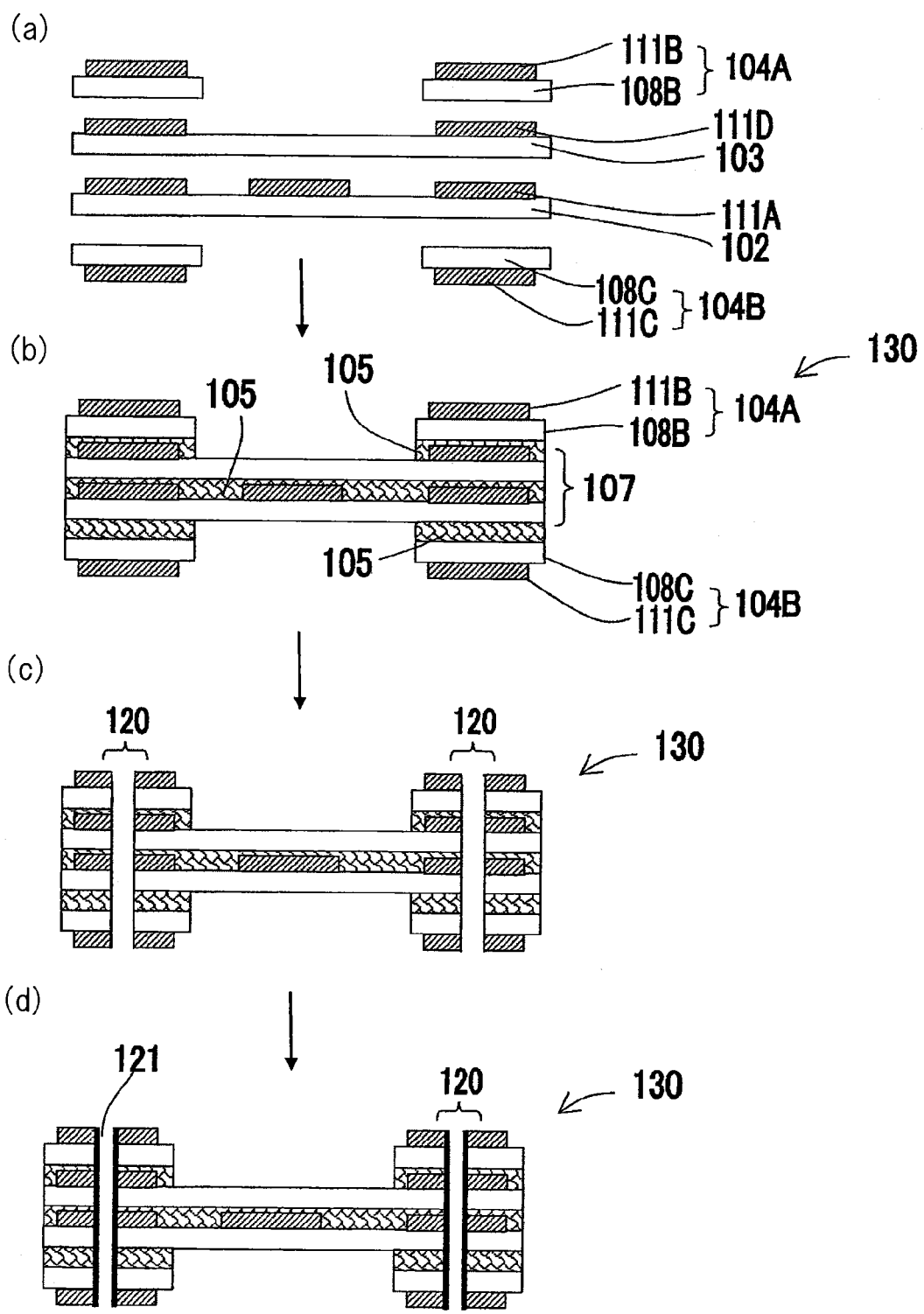
FIG. 9 is a schematic cross-sectional view for illustrating a method of producing a rigid-flexible circuit board according to the embodiment in FIG. 6.

Thereafter, thermo-compression bonding was conducted by disposing the flexible boards 102 and 103 obtained in Reference Example C4, the rigid board 104 obtained in Reference Example C5, and the adhesive material sheet 105 in a configuration as shown in FIG. 9 (b) under vacuum at a compression pressure of 2 MPa at 180° C. for 5 minutes to obtain a rigid-flexible circuit board 130.

In order to achieve electric conduction between both surfaces, the rigid parts were pierced through using laser beam to obtain through-holes 120, 120, followed by copper metal plating to the through-holes 120, 120 to form plated through-holes 121, 121, respectively. Physical properties of the obtained rigid-flexible circuit board 130 were evaluated.

EXAMPLE C2

In a manner similar to Example C1 except that an adhesive material sheet 105 was obtained by changing the formulation proportion into 30 parts by mass of the thermosetting polyphenylene ether-based resin, 70 parts by mass of the styrene-based polymer and 1 part by mass of the epoxy resin, a rigid-flexible circuit board 130 was obtained. Physical properties of the obtained rigid-flexible circuit board 130 were evaluated. It should be noted that the adhesive layer has a glass transition temperature of 200° C.

EXAMPLE C3

In a manner similar to Example C1 except that an adhesive material sheet 105 was obtained by changing the formulation proportion into 20 parts by mass of the thermosetting polyphenylene ether-based resin, 80 parts by mass of the styrene-based polymer and 1 part by mass of the epoxy resin, a rigid-flexible circuit board 130 was obtained. Physical properties of the obtained rigid-flexible circuit board 130 were evaluated. It should be noted that the adhesive layer has a glass transition temperature of 185° C.

EXAMPLE C4

In a manner similar to Example C1 except that an adhesive material sheet 105 was obtained by changing the formulation proportion into 60 parts by mass of the thermosetting polyphenylene ether-based resin, 40 parts by mass of the styrene-based polymer and 1 part by mass of the epoxy resin, a rigid-flexible circuit board 130 was obtained. Physical properties of the obtained rigid-flexible circuit board 130 were evaluated. It should be noted that the adhesive layer has a glass transition temperature of 238° C.

EXAMPLE C5

In a manner similar to Example C1 except that an adhesive material sheet 105 was obtained by changing the formulation proportion into 10 parts by mass of the thermosetting polyphenylene ether-based resin, 90 parts by mass of the styrene-based polymer and 1 part by mass of the epoxy resin, a rigid-flexible circuit board 130 was obtained. Physical properties of the obtained rigid-flexible circuit board 130 were evaluated. It should be noted that the adhesive layer has a glass transition temperature of 170° C.

REFERENCE COMPARATIVE EXAMPLE C1

Thermo-compression bonding was conducted by disposing the flexible boards 102 and 103 obtained in Reference Example C4, the rigid board 104 obtained in Reference Example C5, and the thermoplastic liquid crystal polymer film (A) obtained in Reference Example C1 as the adhering layer 105 in a configuration as shown in FIG. 9 (*b*) under vacuum at a compression pressure of 4 MPa at 300° C. for 60 minutes to obtain a rigid-flexible circuit board 130.

In order to achieve electric conduction between both surfaces, the rigid parts were pierced through using laser beam to obtain through-holes 120, 120, followed by copper metal plating to the through-holes 120, 120 to form plated through-holes 121, 121, respectively. Physical properties of the obtained rigid-flexible circuit board 130 were evaluated.

REFERENCE COMPARATIVE EXAMPLE C2

Thermo-compression bonding was conducted by disposing the flexible board 102 and 103 obtained in Reference Example C3, the rigid board 104 obtained in Reference Example C5, and the thermoplastic liquid crystal polymer film (A) obtained in Reference Example C1 as the adhesive material sheet 105 in a configuration as shown in FIG. 9 (*b*) under vacuum at a compression pressure of 4 MPa at 300° C. for 60 minutes to obtain a rigid-flexible circuit board 130.

In order to achieve electric conduction between both surfaces, the rigid parts were pierced through using laser beam to obtain through-holes 120, 120, followed by copper metal plating to the through-holes 120, 120 to form plated through-holes 121, 121, respectively. Physical properties of the obtained rigid-flexible circuit board 130 were evaluated.

TABLE 9

| | Lamination Condition | | | Adhesive layer | | Circuit board | | | | |
|---|---|---|---|---|---|---|---|---|---|---|
| | Lamination temperature (° C.) | Lamination pressure (MPa) | Lamination time (min) | Proportion of PPE polymer (%) | Glass transition temperature (° C.) | Tensile modulus (GPa) | Resistance temperature to soldering (° C.) | Interlayer adhesion strength (kN/m) | Insertion loss (10 GHz) (dB/10 cm) | Dimensional stability (%) |
| Example C1 | 180 | 2 | 5 | 50 | 230 | 3.5 | 330 | 1.1 | 1.3 | −0.02 |
| Example C2 | 180 | 2 | 5 | 30 | 200 | 3.5 | 320 | 1.0 | 1.5 | −0.05 |
| Example C3 | 180 | 2 | 5 | 20 | 185 | 3.5 | 300 | 1.0 | 1.5 | −0.10 |
| Example C4 | 180 | 2 | 5 | 60 | 238 | 3.5 | 330 | 1.0 | 1.0 | −0.02 |
| Example C5 | 180 | 2 | 5 | 10 | 170 | 3.5 | 290 | 1.2 | 2.0 | −0.15 |
| Comparative Example C1 | 300 | 4 | 60 | — | — | 3.5 | 330 | 1.2 | 1.0 | +0.02 |
| Comparative Example C2 | 300 | 4 | 60 | — | — | 3.5 | 280 | 1.0 | 1.0 | +0.02 |

As shown in Table 9, it is possible for Examples C1 to C5 to produce the rigid-flexible circuit boards having excellent dielectric properties, even if each of the rigid-flexible circuit boards was formed at a low temperature, under a low pressure, and for a short time. In particular, Examples comprising adhesive layers each having a proportion of polyphenylene ether-based resin from 20 to 60 mass % are quite excellent in adhesion, dielectric properties and dimensional stability.

On the other hand, it is possible for Reference Comparative Examples C1 and C2, which are outside the scope of the prior art and only used for showing the comparative effect of Examples C, to obtain the rigid-flexible circuit boards having excellent dielectric properties. However, Reference Comparative Examples C1 and C2 require more severe condition for lamination at a higher temperature under higher pressure for a long period.

INDUSTRIAL APPLICABILITY

The thermoplastic liquid crystal polymer film according to the present invention may be utilized as a substrate material for electric and electronic products used in high frequency. According to the present invention, it is also possible to produce a circuit board comprising a thermoplastic liquid crystal polymer film as a substrate material or a coverlay using equipment which is commonly used for lamination, for example equipment used for lamination of thermosetting resins, efficiently at a low temperature so as to reduce the processing cost.

Preferred embodiments of the present invention are shown and described. It is to be understood that various changes, modifications and omissions may be made without departing from the spirit of the present invention and are encompassed in the scope of the claims.

DESCRIPTION OF REFERENCE NUMERALS 1001A, 1001B, 2001, 11A, 11B, 11C, 111A, 111B, 111C, 111D, 211A, 211B, 211C, 211D, 211E, 311A, 311B, 311C, 311E: conductive part
1002A, 1002B, 2002: insulating substrate
1004A, 1004B, 2004: circuit layer
30, 130, 230, 330: rigid-flexible circuit board
2, 102, 202, 302: flexible insulating substrate
3, 103, 203, 303, 306, 2003: coverlay
4A, 4B, 104A, 104B, 204A, 204B, 304A, 304B: rigid circuit layer
5, 105, 205, 305, 1005, 2005: adhesive layer
7, 107, 207, 307: flexible circuit board
8B, 8C, 108B, 108C, 208B, 208C, 308B, 308C: rigid insulating substrate
31, 131, 231, 331: flexible part
32, 132, 232, 332: rigid part

What is claimed is:

1. A circuit board at least comprising:
a liquid crystal polymer film including a thermoplastic polymer capable of forming an optically anisotropic melt phase (hereinafter referred to as a thermoplastic liquid crystal polymer film) and
an adhesive layer comprising a polyphenylene ether-based resin, wherein
the thermoplastic liquid crystal polymer film constitutes at least one circuit board material selected from the group consisting of an insulating substrate, a circuit layer material, and a coverlay,
the thermoplastic liquid crystal polymer film is laminated to another circuit board material constituting the circuit board via the adhesive layer, and
the adhesive layer has a glass transition temperature of from 200° C. to 300° C.

2. The circuit board as claimed in claim 1, wherein the adhesive layer comprises the polyphenylene ether-based resin in a proportion of 10% by mass or greater.

3. The circuit board as claimed in claim 1, wherein the thermoplastic liquid crystal polymer film has a melting point of 295° C. or higher.

4. The circuit board as claimed in claim 1 comprising:
a circuit layer comprising an insulating substrate of the thermoplastic liquid crystal polymer film, and one or more conductive parts disposed on one surface or each surfaces thereof, wherein
at least one surface of the circuit layer is laminated to another circuit board material via the adhesive layer comprising the polyphenylene ether-based resin.

5. The circuit board as claimed in claim 4 comprising:
at least two circuit layers each comprising a thermoplastic liquid crystal polymer film and one or more conductive parts on one surface or each surface thereof, and
the adhesive layer comprising the polyphenylene ether-based resin interposed between the circuit layers.

6. The circuit board as claimed in claim 4, wherein the conductive part has a maximum surface roughness of 2.0 μm or lower.

7. The circuit board as claimed in claim 4, comprising one or more circuit layers, and one or more adhesive layers.

8. The circuit board as claimed in claim 1, comprising:
the thermoplastic liquid crystal polymer film as a coverlay to cover at least a portion of a conductive wiring pattern via the adhesive layer comprising the polyphenylene ether-based resin.

9. The circuit board as claimed in claim 1, wherein the circuit board has a solder heat resistant temperature of 295° C. or higher.

10. The circuit board as claimed in claim 1, wherein the circuit board has an insertion loss at a frequency of 10 GHz of 3.0 dB/10 cm or less.

11. The circuit board as claimed in claim 1 comprising a laminated part comprising the adhesive layer providing adhesion between thermoplastic liquid crystal polymer films, the laminated part having a tensile modulus of 2.0 GPa or higher.

* * * * *